(12) United States Patent
Lee et al.

(10) Patent No.: US 12,699,325 B2
(45) Date of Patent: Aug. 4, 2026

(54) SYSTEMS AND METHODS FOR COMBINATORIAL ARRAYS USING DYNAMIC INTERFERENCE LITHOGRAPHY

(71) Applicant: Rutgers, The State University of New Jersey, New Brunswick, NJ (US)

(72) Inventors: Ki-Bum Lee, Monmouth Junction, NJ (US); Letao Yang, Piscataway, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 1185 days.

(21) Appl. No.: 17/653,357

(22) Filed: Mar. 3, 2022

(65) Prior Publication Data

US 2022/0283510 A1    Sep. 8, 2022

Related U.S. Application Data

(60) Provisional application No. 63/156,548, filed on Mar. 4, 2021.

(51) Int. Cl.
G03F 7/00 (2006.01)

(52) U.S. Cl.
CPC ...... G03F 7/70408 (2013.01); G03F 7/70316 (2013.01)

(58) Field of Classification Search
CPC .............. G03F 7/70408; G03F 7/2053; G03F 7/70025; G03F 7/70316; G03F 7/40; G03F 7/038; G03F 7/70375; G03F 7/70383; G03F 7/70391; G03F 7/704; G03F 7/70416; G03F 7/70425; G03F 7/70433; G03F 7/7045; G03F 7/70458; G03F 7/70466; G03F 7/70475; G03F 7/70483; G03F 7/702; G03F 7/70191; G03F 7/7015; G03F 7/70158; G03F 7/70166; G03F 7/70175;

(Continued)

(56) References Cited

U.S. PATENT DOCUMENTS 3,630,593 A    12/1971  Bartelt et al.
5,546,214 A  *   8/1996  Black ................... A61B 18/203
                                                           359/201.1

(Continued)

FOREIGN PATENT DOCUMENTS

CN          107643656 A  *   1/2018
KR          101753355 B1  *   7/2017   ......... G03F 7/70025

OTHER PUBLICATIONS

English translation of KR101753355, published Jul. 6, 2017. (Year: 2017).*

(Continued)

*Primary Examiner* — Christina A Riddle
(74) *Attorney, Agent, or Firm* — FOX ROTHSCHILD LLP

(57) ABSTRACT

A dynamic interference lithography (DIL) device is provided. The device includes a laser source configured for providing a laser beam, a substrate stage configured for mounting a substrate, an at least partially convex curved mirror, and a spatial filter configured to divide the laser beam into a first beam portion directed towards the at least partially convex curved mirror and a second beam portion directed towards the substrate. The first beam portion is reflected by the at least partially convex curved mirror towards the substrate to form an interference pattern on the substrate.

9 Claims, 15 Drawing Sheets

(58) Field of Classification Search

CPC ............. G03F 7/70183; G03F 7/70141; G03F 7/70308; G03F 7/7035; G03F 7/70358; G03F 7/70366; G03F 7/708; G02B 5/1809; G02B 5/1814; G03H 1/26; G03H 2001/0094; G03H 2001/0428; G03H 2227/03; G03H 2223/12; G03H 2210/20; G03H 2240/11

USPC .......... 355/18, 27, 30, 44, 46, 52–55, 66–77

See application file for complete search history.

(56) References Cited

U.S. PATENT DOCUMENTS

| | | | | |
|---|---|---|---|---|
| 7,229,178 | B1 * | 6/2007 | Headley | ............. G02B 26/0825 |
| | | | | 359/849 |
| 8,399,184 | B2 | 3/2013 | Kim et al. | |
| 9,618,501 | B2 | 4/2017 | Mohapatra et al. | |
| 2010/0284015 | A1 * | 11/2010 | Sewell | ............... G03F 7/70408 |
| | | | | 356/450 |
| 2013/0135601 | A1 * | 5/2013 | Okazaki | ............. G03F 7/70408 |
| | | | | 355/67 |
| 2017/0123325 | A1 * | 5/2017 | Hung | ................... G02B 27/106 |

OTHER PUBLICATIONS

Kao et al., "Silicon photonics waveguide chirped gratings enabled by laser interference lithography," 2018 23rd Opto-Electronics and Communications Conference (OECC), Jeju, Korea (South), Jul. 2-6, 2018, pp. 1-2. (Year: 2018).*

English translation of CN-107643656-A. (Year: 2018).*

Downing, et al: "Biophysical Regulation of Epigenetic State and Cell Reprogramming", Nature Materials, Dec. 2013, vol. 12, pp. 1154-1162.

Kim, et al: "Period-Chirped Gratings Fabricated by Laser Interference Lithography with a Concave Lloyd's Mirror"; Applied Optics, Jan. 10, 2016, vol. 55, No. 2, pp. 354-359.

Kim, et al: "Matrix Nanotopography as a Regulator of Cell Function"; Journal of Cell Biology, Apr. 2012, vol. 197, No. 3, pp. 351-360.

* cited by examiner

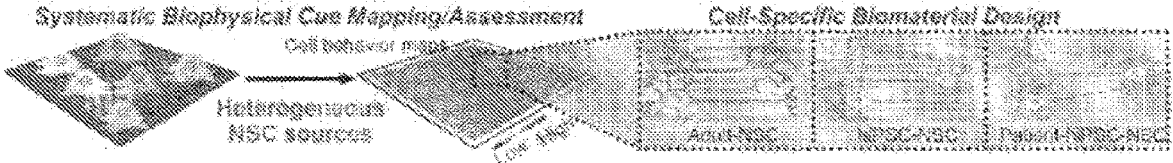
FIG. 10A
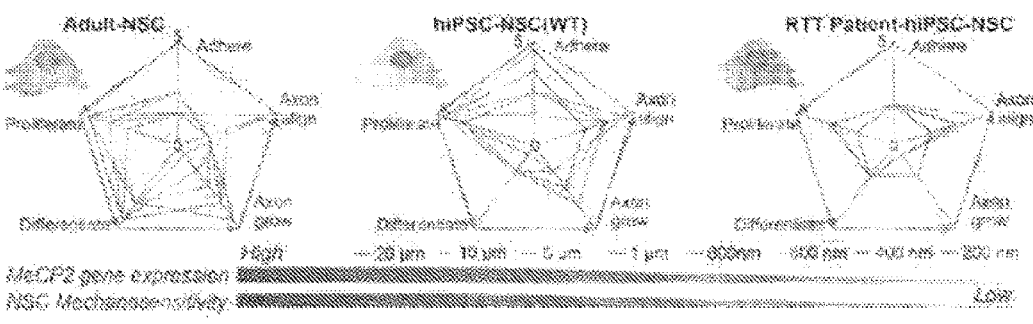
FIG. 10B
FIG. 10C

SYSTEMS AND METHODS FOR COMBINATORIAL ARRAYS USING DYNAMIC INTERFERENCE LITHOGRAPHY

CROSS REFERENCE TO RELATED APPLICATION

This application claims priority to U.S. Provisional Patent Application No. 63/156,548, filed Mar. 4, 2021, the disclosure of which is incorporated herein by reference in its entirety.

STATEMENT REGARDING FEDERALLY SPONSORED RESEARCH OR DEVELOPMENT

This invention was made with government support under Grant Nos. 1R01DC016612 and R21AR071101 awarded by The National Institutes of Health and Grant No. CBET-1803517 awarded by The National Science Foundation. The government has certain rights in the invention.

TECHNICAL FIELD

The present invention generally relates to a method of making novel arrays including heterogeneous topographic features. The present invention also relates to an array and uses thereof for controlling the growth and differential of cells in vitro.

BACKGROUND

Biophysical cues mediated by natural or synthetic extracellular matrices (ECMs) play an essential role in cellular reprogramming. In nature, ECM is structurally complex, spanning a wide range of sizes and hierarchical topographies. As such, understanding how surface topography affects cellular functions is integral in developing purpose-specific cell regulating cues in various biomedical applications. In studies involving cell behavior in vitro, and particularly in studies involving growth and differentiation of stem cells in vitro, it is important to control cellular behavior including growth, differentiation, morphology, alignment, adhesion, proliferation, apoptosis, and migration. In the future, controlled growth and differentiation of stem cells into particular cell types and tissues may be used to replace or help repair damaged cells that result from injury, disease, and aging. The fundamental challenge of current stem cell research is characterization of environmental factors that modulate differentiation and self-renewal. One of the main obstacles facing cell-topographical studies is the lack of a single surface possessing a large range of different topographies (such as different heights, dimensions, feature shapes, etc.) in order to facilitate fast screening and subsequent analysis of the data generated.

The lack of such multi-architectural surfaces is due to the fact that there is no one single patterning technique that can be used to simultaneously fabricate multiple surface topographical features onto a single substrate. All existing lithography techniques are limited to specific geometries and resolutions. Therefore, different techniques have to be used for each specific geometry, resolution and aspect ratio. For example, optical lithography is used for microscale feature resolutions; electron-beam lithography is used for nanoscale feature resolutions; gray mask lithography is used for different aspect ratio patterns; optical lithography in combination with isotropic etching is used for curved features; and interference lithography is used for three-dimensional structures. Thus, in order to create a multi-architectural topographical surface on a single substrate, each technique needs to be employed separately where all the other patterns must be masked whilst each new pattern is being fabricated. This task is clearly challenging and not practical if a large number of vastly different topographies are involved.

This document describes new methods and systems directed to solving the issues described above, and/or other problems.

SUMMARY

In one or more scenarios, a dynamic interference lithography (DIL) device is disclosed. The DIL device may include a laser source configured for providing a laser beam, a substrate stage configured for mounting a substrate, an at least partially convex curved mirror, and a spatial filter configured to divide the laser beam into a first beam portion directed towards the at least partially convex curved mirror and a second beam portion directed towards the substrate. The first beam portion when reflected by the at least partially convex curved mirror towards the substrate to form an interference pattern on the substrate. Optionally, the interference pattern may include a plurality of heterogeneous topographical patterns.

In one or more implementations, the at least partially convex curved mirror may be mounted on a rotatable stage configured for adjusting a location on the at least partially convex curved mirror where the first beam portion is reflected from and/or an angle at which the first beam portion impinges on the at least partially convex curved mirror. In certain implementations, the DIL device may also include a controller device configured to control the laser source for providing a desired number of laser beams.

In certain implementations, the interference pattern may include a plurality of heterogeneous topographical patterns. Such interference patterns may include topographic features such as, without limitation, grooves, grids, pores, lines, dots, bumps, gratings, pillars, dimples, curved lens structures, and/or complex three-dimensional hierarchical structures of calculated dimensions. Optionally, at least two of the plurality of heterogeneous topographic patterns have topographical features that differ in one or more properties such as, without limitation, shape, size, height, pitch, orientation, type, periodicity, spacing, composition, elasticity, or stiffness.

In certain implementations, the DIL device may also include a controller device configured to control a position of the at least partially curved mirror to create formation of the interference pattern that comprises the plurality of heterogeneous topographic patterns. For example, the controller device may control a position of the at least partially curved mirror such that an angle of incidence of the first beam portion on the at least partially curved mirror is about 0°-90°.

Optionally, a focal length of the at least partially convex mirror is about 1.0 millimeter to about 1.0 meter.

In certain other scenarios, a patterned surface for cell culture is disclosed. The patterned surface may include a substrate, and a photoresist layer over the substrate that is topographically structured with a plurality of heterogeneous topographical patterns. Alternatively and/or additionally, at least two of the plurality of heterogeneous topographic patterns have topographical features that differ in at least one of the following properties: shape, size, height, pitch, orientation, type, periodicity, spacing, composition, elasticity, or stiffness.

Optionally, the plurality of heterogeneous topographic patterns may include topographic features such as, without limitation, grooves, grids, pores, lines, dots, bumps, gratings, pillars, dimples, curved lens structures, and complex three-dimensional hierarchical structures of calculated dimensions.

In some implementations, the patterned surface may include at least one topographical feature having a size of less than about 100 nm, and at least one topographical feature having a size of more than about 20 μm. Additionally and/or alternatively, the plurality of heterogeneous topographical patterns may include at least one hundred topographical features having a size of less than about 100 nm, and at least one topographical feature having a size of about 20 μm.

The plurality of heterogeneous topographical patterns may include, for example, at least one line-shaped topographical pattern and at least one dot-shaped topographical pattern and/or at least one line-shaped topographical pattern and at least one grid-shaped topographical pattern. Additionally and/or alternatively, the plurality of heterogeneous topographical patterns may include at least one hundred line-shaped topographical features having a plurality of sizes and at least one hundred grid-shaped topographical features having a plurality of sizes.

BRIEF DESCRIPTION OF THE DRAWINGS

FIG. 10A illustrates schematic diagram of the heterogenous cellular responses to biophysical cues investigated using the patterned surface-based predictive mapping discussed above. FIG. 10B illustrates radar charts of 3 NSC lines [adult-NSC, human induced pluripotent stem cell derived NSC wild type (hiPSC-NSC-WT), and Rett Syndrome (RTT) patient-derived hiPSC-NSC (RTT-patient-hiPSC-NSC)]. FIG. 10C illustrates mRNA microarray results showing the reduced expression of mechanotransduction-relevant genes in RTT-patient-hiPSC-NSCs.

DETAILED DESCRIPTION

Figure 1:
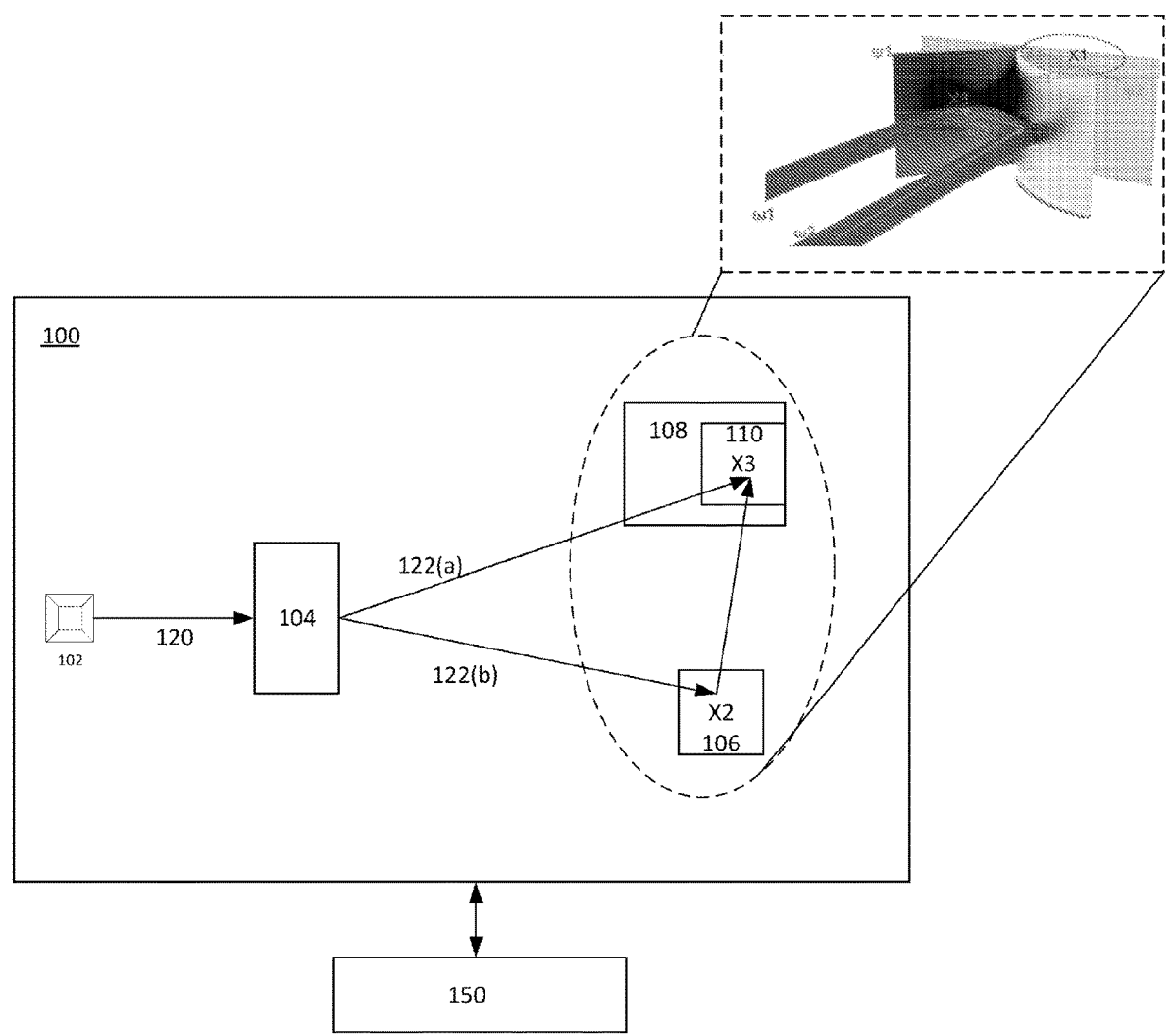
FIG. 1 is a schematic diagram of an example dynamic interference lithography (DIL) system for fabricating a topographically patterned surface.

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

This disclosure describes systems and methods for generation of a patterned surface, which includes a planar surface having patterned topography that includes multi-structural features. The disclosure further describes systems and methods that use topographic cueing by designing substratum topography to affect and control cell behavior including cell growth, differentiation, development, and proliferation. Specifically, the modulation of behavior of cells grown in vitro by designing patterned structures that affect the behavior of cells grown in vitro is described. The heterogeneously patterned surface of the current disclosure provides enhanced means to affect growth and development of the cells as compared to the growth and development of the cells on a surface in the absence of the patterned topography and/or a uniformly patterned surface. Specifically, the patterned surface provides a substrate for i) the development of advanced techniques to emulate multiple biophysical cues, ii) predictive and trackable approaches to screen biophysical signaling pathways, and iii) an advanced biomaterial method to confirm the functions of the identified biophysical cues optimal for cellular reprogramming.

The use of topographic cueing using specific dimensional features may participate in determining the differentiation fate of stem cells and participate with other soluble factors in ultimately determining the pathways of differentiation pursued (or the creation/retention of the de-differentiated state). The physical topography of the substrates can be varied and used to modulate the growth and developmental state of stem cells as well as other undifferentiated cells such as fibroblasts.

The ability to spatially localize and control interactions of cell types on polymeric or inorganic materials presents an opportunity to engineer hierarchically and more physiologically correct tissue analogs for mechanical, biochemical, functional, experimental, and clinical purposes. This disclosure has broad applications to areas such as in vitro cell culture and stem cell biology. The patterned surfaces of this disclosure make it possible to consider nanoscale topographic substrates and cues as a fundamental factor for the predictable culture of stem cells in the lab and in medical implants. For example, the patterned surface of the current disclosure may be used in screening experiments such as, without limitation, high throughput cellular screening, cellular screening for pharmaceutical, diagnostic or clinical applications, basic biological studies, genetic assays, gene expression studies, systematic cellular knock-down, regenerative medicine and tissue engineering.

As used herein, the term "topographic feature" (or "topographic structure") refers to an individual unit of a topographically patterned surface. A nano-topographic feature is a geometric structure having any shape (e.g., grooves, grids, pores, and bumps) which does not exceed 1 micron in height, width or diameter. In the x, y, and/or z-dimension, a nano-topographic feature can be less than 1 micron, e.g., about 0.1 nm-10 nm, about 10 nm-25 nm, about 25 nm-50 nm, 50 nm-100 nm, 100 nm-500 nm, 500 nm-900 nm. Given that the diameters of most natural extracellular matrix (ECM) fibrils (e.g., collagen and laminin) are within a similar size range (sub-100 nm to sub-100 μm), the patterned surfaces of the current disclosure may facilitate the investigation of numerous cell-ECM interactions simultaneously.

The various topographic features include, but are not limited to gratings, pillars and dimples, curved lens structures, grooves, grids, pores, bumps, lines, dots, as well as complex three-dimensional hierarchical structures, with different resolutions and aspect ratios. Accordingly, topographic patterns of this disclosure comprise periodic arrays of grooves, grids, pores, lines, dots, bumps, gratings, pillars and dimples, curved lens structures as well as complex three-dimensional hierarchical structures of calculated dimensions. Specifically, biophysical cues in the forms of dots (0D), lines (1D), grids (2D), and hierarchical micro/nano-structures of various sizes, commonly observed in natural ECM structures, may be precisely fabricated using the systems and methods of the current disclosure. Periodicity of the topographic patterns can be designed such that there are equal lines and spaces (e.g., 70 nm lines and spaces). It is also possible to have spaces much larger than the lines, if only a few lines (e.g., 70 nm lines), for instance, are needed to provide a desired effect, such as good adherence to a much larger cell. In this regard, designs can be provided with increased space between the nanoscale grooves.

The type, size, and periodicity of the topographic features in an array can influence a specific cell behavior. Such arrangements can be provided by the topographic designs of the invention. Standard assays known in the art can be performed to quantify the ability of fabricated and patterned surfaces to modulate fundamental cell behaviors such as proliferation, adhesion, migration, and differentiation. The choice of geometry and dimensions of topographic patterns can also be customized (as discussed below) to achieve the desired tissue micro-architecture based on the empirical adherence of cells to a particular pattern and subsequent cell behavior.

Fabrication of Pattered Surface

This disclosure contemplates the design and manufacturing of a variety of topographically patterned surfaces for, for example, culturing cells. Non-limiting examples of materials that can be produced with patterned surfaces include consumables such as microplates, culture dishes, microscope slides, chips, etc. and/or other substrates that can be used with such consumables. Surfaces can be made using different materials. Surfaces can be fabricated using, for example, metals, glass, alloys, polymer, silicon, and mixtures thereof. In some embodiments, surfaces are pretreated prior to patterning. Pretreatment can, for example, be used to smoothen the surface, for coating a photoresist layer, or the like.

The surface may be in the form of a plate, a tube, sphere, or complex shape. In some embodiments, the surface is in the form of a plate (e.g., a cell culture plate) or a dish (e.g., a Petri dish) so that the formed article can be used directly as a cell culture substrate. Optionally, the surface may be a substrate that can be inserted into an article such as a cell culture plate. In certain instances, the surface is substantially planar. The surface may also have a convex shape, a concave shape, or other suitable shapes for cell culture substrates.

Laser interference lithography has been widely used as an effective, mask-free, and inexpensive technique for the fabrication of uniform nanopatterns and photonic materials on substrates. There are various geometrical configurations of interference lithography (IL) systems such as the Lloyd's mirror interferometer. A Lloyd's mirror interferometer includes a mirror that is oriented perpendicular to a substrate stage, where a simple angular rotation of the entire device results in a nanoscale patterning (also referred to as "nanopatterning") with controlled pattern periodicity. Specifically, a Lloyd's interferometer operates by first sending a single laser beam through a spatial filter to remove optical noise and create a diverging beam. Half of the beam travels directly to the substrate acting as the first source. The other half of the diverging beam, reflects off of the mirror and onto the substrate acting as the second source. These two halves of the same laser interfere with each other and create an interference pattern at the observation plane where the substrate is mounted. If there is a photoresist layer on the substrate, the interference pattern will drive a chemical reaction and the pattern will be transferred to the photoresist.

However, such an interferometer produces uniform patterns over a given area, and the effective pattern coverage area is dependent on the mirror size and the optical coherence length in such a way that the coverage area is usually much less than the size of either. The Lloyd's interferometer is, therefore, not suitable for fabrication of a variety of multiple and/or gradually changing topographic features or structures on a single substrate (e.g., for studying the effect of surface topographies on stem cell differentiation, where the objective is to examine how cells respond to lines, broken lines and dots or combinations of them on microscopic to nanoscopic scales). The current disclosure describes a dynamic interference lithography (DIL) system that utilizes a specifically designed curved mirror in an interoferometer in order to produce multiple different topographic features on a single substrate.

FIG. 1 illustrates a schematic representation of a DIL system 100 for fabricating a topographically pattered surface. As shown in FIG. 1, the system includes a laser light source 102, a spatial filter 104, a curved mirror 106, and a substrate stage 108 for mounting a substrate 110. Optionally, the substrate stage is rotatable, where the rotational position of the substrate stage may be modulated to control the angle within the topographical features. For example, grid shaped topographical features may be generated by rotating the substrate by a desired angle (i.e., by rotating the substrate stage) after the first exposure (and before the second exposure), where the rotation angle determines the angles within the grid patterns. Examples of such rotation angles may include without limitation about 90°, about 120°, about 100°, about 110°, about 45°, about 135°, about 45°-135°, about 60°-120°, about 75°-115°, or the like.

Optionally, the curved mirror may also be mounted on a rotatable having an axis of rotation that may, for example, be perpendicular to the plane of FIG. 1. For instance, the angle of incidence of the first beam portion 112(a) on the curved mirror may be about 0° to about 90°, about 10° to about 80°, about 20° to about 70°, about 30° to about 60°, about 40° to about 50°, or the like modulated by controlling the position of the curved mirror (controlled via the controller).

In some embodiments, the substrate 110 may include a surficial layer of photoresist (PR) of a type that may be exposed to light and then developed by a chemical solution. Examples of the photoresist material can include, without limitation, resins, norbornene hydrogels, acrylate hydrogels, polyethylene glycol hydrogels, gelatin hydrogels, hyaluronic acid hydrogels, azide functionalized hydrogels, silicon hydrogels, SU-8, and AZ 2020.

In certain instances, one or more components of the DIL system are in communication with a controller 150 using any now or hereafter known communication protocols, for example, wired connections, wireless communication links, or fiber optic cables, and may provide any suitable medium of communications such as WiFi, Bluetooth, Ethernet, cellular, intranet, and Internet. The controller 150 may be configured to control operations of one or more components of the DIL system 100. For example, the controller may control the rotation of the rotatable stage on which the curved mirror is mounted in order to modulate the angle of incidence/position X2, and consequently the interference pattern at position X3. In another example, the controller may control the operations of the light source 102 to modulate the number of exposures, the laser wavelength, phase difference between exposure, or the like. For example, the phase difference between a first exposure and a second exposure may be a phase difference of 180°, a phase difference of 120° may be used between three exposures. Moreover, a phase difference of 90° may be used between four exposures. In other embodiments, various other phase differences between various exposures may be used to vary the width or placement of exposed portions of the photoresist layer.

The lithography system 100 is arranged such that a laser beam 120 of a wavelength λ (e.g., λ=325 nm for a HeCd laser) passes through the spatial filter 104 which expands the cross-sectional area of the beam 120. At least a first portion 122(a) of the expanded beam is reflected by the curved mirror 106 at point X2 (which is positioned on the rotatable stage) to impinge onto the substrate 110 at point X3. A second portion 122(b) of the expanded beam impinges directly on the substrate 110 (also at point X3) such that the reflected beam and the directly incident beam cross each other, creating an interference pattern (not shown) at the photoresist layer of the substrate 110. Rotation of the rotatable stage is used to control an angle β and the location X2 (at which the first portion of the expanded beam impinges on the curved mirror 106), which in turn allows for control for the angle between the two interfering beams and thus the periodicity of the interference fringe patterns (i.e., the topographic pattern) registered on the photoresist layer of the substrate. In addition, the properties of the topographic patterns (i.e., arrays) can be controlled by controlling, for example, the focal length of the curved mirror, the angular range of the curved mirror, the angle between the curved mirror and photoresist-coated substrate, and the angle between incident laser and the photoresist-coated substrate. Optionally, the properties of the topographic features may also be controlled based on the composition of the photoresist (PR) layer on the substrate, an exposure time, the number of exposures, the rotation of the substrate, the time of developing and etching, the thickness of photoresist coating, or the like. Examples of such properties of topographic patterns include, without limitation, shape (e.g., lines, grooves, grids, dots, etc.), size, height, pitch, orientation, type, periodicity, spacing, composition, elasticity, stiffness, or the like.

For example, different PR layer compositions can yield in topographical features of different types and/or having differing stiffness. One example is the use of polyethylene glycol diacrylate (PEGDA) as a PR during the light exposure can result in combinatorial topographical features/arrays with different stiffness, with higher molecular weight of PEGDA leading to lower stiffness and lower molecular weight of PEGDA leading to higher stiffness. For instance, negative tone PR compositions that can be crosslinked and/or become insoluble upon exposure to light (e.g., photo cross-linkable hydrogels, SU-8 resin, AZ 125nXT, AZ 15nXT (115CPS), AZ 15nXT (450CPS), AZ nLof 2020, AZ nLof 2035, AZ nLof 2070, AZ nLof 5510, KMPR® series, UVN-30, ma-N 1400 series, ma-N 2400 series, etc.) can be used to generate patterned surfaces that primarily include grid-shaped topographical features/arrays (after two exposures with rotation of the substrate). On the other hand, positive tone PR compositions that become soluble upon exposure to light (e.g., AZ 10XT, AZ 12XT, AZ 40XT, AZ 4533, AZ 4562, AZ IPS 6090, AZ P4110, AZ P4620, AZ P4903, PL 177, etc.) can be used to generate patterned surfaces that primarily include dot-shaped topographical features/arrays.

In another example, the exposure time may be used to modulate different properties of the patterned surface. For example, when negative PR is used, a reduced exposure (e.g., less than about 10 seconds) combined with double exposure and substrate rotation may lead to the formation of dot-shaped topographical features/arrays with decreased height of the formed topographical features/arrays compared to when a longer exposure time is used. When a positive PR is used, a prolonged exposure (e.g., more than one minute) combined with double exposure and substrate rotation may generate patterned surfaces that primarily include grid-shaped topographical features/arrays.

The number of exposure also influences the type of topographical features formed. For example, a single exposure may generate primarily line-shaped topographical features/arrays, while a second additional exposure with a rotation of the substrate may generate primarily dot-shaped or grid-shaped topographical features/arrays in addition to and/or instead of the line-shaped topographical features/arrays. The angle of substrate rotation between two exposures may be modulated to control the type topographical features/arrays as well. For example, a 90° rotation of the substrate in between the two exposure will result in grid-shaped or square-shaped topographical features/arrays. A 120° rotation of the substrate in between the two exposure will result in rhombus-shaped topographical features/arrays.

In yet another example, the time of development after the exposure of PR to laser can affect the formed topographical features/arrays. For example, incubating grid-shaped collection topographical features/arrays formed by exposure negative PR AZ 2020 PR in developing solution for over one minute may change the features to dot-shaped features.

Figures 2A, 2B, 2C, 2D:
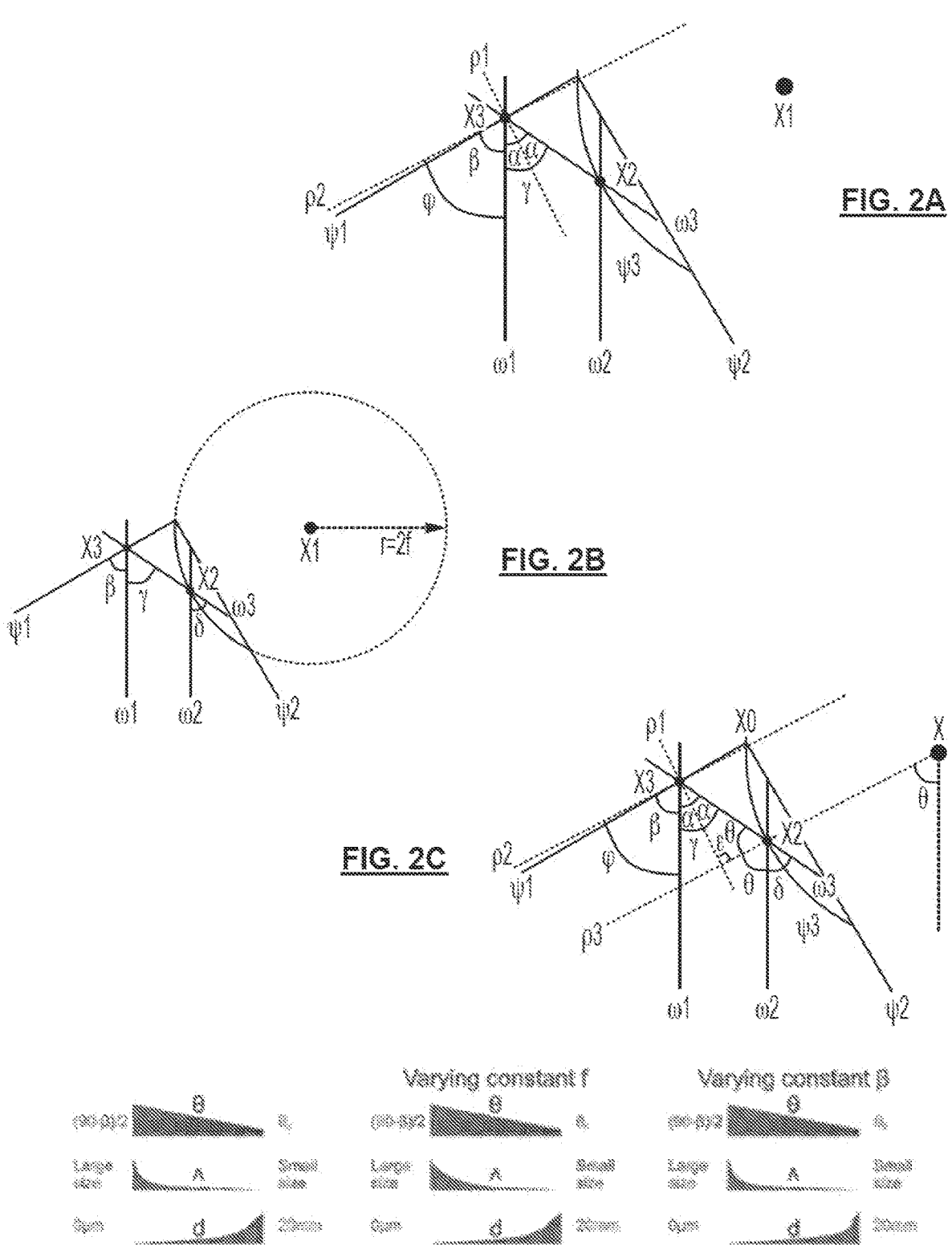
FIGS. 2A-2C illustrate a ray diagram for calculation of the pitch size of the light interference patterns obtained on the substrate as a function of spatially transformed interference angles.
FIG. 2D illustrates a schematic representation of example relationships between different properties of a DIL system (e.g., of FIG. 1) and the size ranges of the topographical features/arrays formed on a substrate using the DIL system.

The curved mirror 106 may be a spherical convex mirror, a cylindrically convex mirror, a concavo convex mirror, a plano convex mirror, a convexo convex mirror, or the like. The curved mirror 106 may be formed from any suitable reflective material such as, without limitation, metal (e.g., aluminum, silver, gold, etc.), acrylic, glass, quartz, silica, etc.; and/or any suitable material with a reflective coating. The radius of curvature or focal length of the curved mirror may be selected to further control the angle between the two interfering beams, and thus the interference patterns created on the substrate. Example focal length of the curved mirror may be about 1 mm to about 1 meter, about 100 mm to about 0.5 meter, about 1 cm to about 0.1 meter, about 1 mm to about 1 cm, or the like. In addition, varying the location (of point X2) on the curved mirror where the first portion 122($a$) impinges the curved mirror transforms the reflected beams into an infinite series of beams with the various $\alpha$ angles leading to continuous changes in the angle between the two interfering beams. This results in a dynamic progression of the interference patterns (i.e., topographic patterns) created at the photoresist layer of the substrate. Specifically, use of the curved mirror spatially transforms the static interference fields of a Lloyd's interferometer into a series of dynamically changing interference events. FIGS. 2A-2C illustrate a ray diagram for calculation of the pitch size of the light interference patterns obtained on the substrate as a function of spatially transformed interference angles.

As shown in FIG. 2A, $\Psi 1$ and $\Psi 2$ indicate the planes where the photoresist layer and the base of the curved mirror are located, respectively. In one example, $\Psi 1$ is vertical to $\Psi 2$, which can be expressed as: $\psi 1 \perp \psi 2$.

$\omega 1$ and $\omega 2$ are representative beams (corresponding to 122($b$) and 122($a$), respectively) from the same laser source (102) after being spatially separated by a beam splitter 104. $\omega 1$ is directed toward the plane $\Psi 1$, at an angle of $\beta$, while $\omega 2$ is directed towards the curved mirror. The surface of the curved mirror is defined as $\Psi 3$. In one example, $\Psi 3$ is a section of a circle with radius r and point X1 defines the center of the circle. Point X2 is a point on the curved mirror where $\omega 2$ and $\Psi 3$ intersect. $\theta$ is defined as the angle between laser beam $\omega 2$ and the line connecting X1 and X2 (defined as line $\rho 3$).

As shown in FIGS. 2A-2C, $\omega 2$ impinges on the curved mirror surface $\Psi 3$ at X2, and is reflected as beam $\omega 3$. A person of skill in the art will understand that per the laws of reflection, the angle between $\rho 3$ and $\omega 3$ is equal to the angle between $\rho 3$ and $\omega 2$ (i.e., $\theta$). Two reference lines $\rho 1$ and $\rho 2$ are defined such that $\rho 1$ is the symmetrical dividing line of $\omega 1$ and $\omega 3$, $\rho 2$ is a line that is vertical to $\rho 1$ (i.e., $\rho 1 \perp \rho 2$). The angle between $\omega 1$ and $\omega 3$ is defined as $\gamma$, and the angle between $\rho 1$ and $\omega 1$ is defined as as $\alpha$. As shown in FIGS. 2A-2C, $\rho 1$ symmetrically divides the angle $\gamma$. Therefore, Given, $2\alpha = \gamma$; $\alpha = \gamma/2$; $\rho 1 \perp \rho 2$; and $\omega 1 | \omega 2 \Rightarrow 2\alpha + 2\theta = 180°$ and $\alpha = 90° - \theta$;

At point X3, the interference pattern between the two laser beams of $\omega 1$ and $\omega 3$ can be calculated as: $\bigwedge 0 = \lambda/2 \sin \alpha$ (based on the principle of superposition waves), where $\bigwedge 0 =$ period of the interference pattern size. The period of an interference pattern size may be about double the size of topographical features when assuming a one-to-one ratio of topographical features and empty space on a patterned surface.

Substituting $\alpha = 90° - \theta \Rightarrow \bigwedge 0 = \lambda/2 \sin \alpha = \lambda/2 \sin(90° - \theta) = \lambda/2 \cos \theta$;

Since photoresist will be placed on the plane $\Psi 1$ instead of $\rho 2$, the projection of the interference pattern at the $\rho 2$ plane on $\Psi 1$ may be defined as: $\bigwedge = \bigwedge 0 \times \sin \varepsilon$ (where, $\varepsilon =$ angle between the $\Psi 1$ and $\rho 2$);

If $\varphi$ is the angle between $\Psi 1$ and $\rho 2$, then $\varepsilon = \varphi - \beta$; $\alpha + \varphi = 90°$ (since $\rho 1 \perp \rho 2$);

Therefore, $\theta = \varphi$, and $\varepsilon = \theta - \beta$ (since, $\alpha + \theta = 90°$);

Given, $\bigwedge = \bigwedge 0 \times \sin \varepsilon$ and $\bigwedge 0 = \lambda/2 \cos \theta \Rightarrow \bigwedge = \lambda \times \sin(\theta - \beta)/2 \cos \theta$.

Various rays in the laser beams may impinge on different multiple points on the surface ($\Psi 3$) of the curved mirror such that the angle $\theta$ is different at different contact points X2 on $\Psi 3$.). In an example embodiment, $\theta$ may continuously change in a single exposure depending on the location of X2 on the curved mirror causing the formation of many different topographical features/arrays on the substrate with varying properties. Moreover, topographical features with varying properties (e.g., sizes) may be produced from a single laser exposure on the same PR coated substrate by, for example, controlling the angle $\theta$ and location of point X2 (and/or other properties of the DIL system as discussed in this disclosure). The system may also modulate the angle $\beta$ by, for example, fixing the laser direction while rotating the photoresist plane around the axis between $\Psi 1$ and $\Psi 2$ in order to tune the variation and ranges of nanostructures on the photoresist plane as well. The ranges of $\theta$ and $\beta$ are about 0° to about 180° (optionally, 0° and 180° may be excluded), and corresponding $\bigwedge$ may be as low about 2 nm, and as high as about 100 μm. Example sizes of topographical features may be about 100 nm to about 40 μm, about 200 nm to about 30 μm, about 300 nm to about 20 μm, about 400 nm to about 10 μm, about 500 nm to about 5 μm, about 750 nm to about 1 μm, or the like. Using the above relationships, the size of patterned topographical features may be about 115 nm when $\theta$ is equal to 45° and $\beta$ is equal to 15°, about 14.4 nm when $\theta$ is equal to 10° and $\beta$ is equal to 5°, about 1318 nm when $\theta$ is equal to 85° and $\beta$ is equal to 40°, about 9276 nm when $\theta$ is equal to 89° and $\beta$ is equal to 4°, about 92769 nm when $\theta$ is equal to 89.9° and $\beta$ is equal to 4.9°. In an example embodiment, the sizes of nanostructures at each point on the substrate is about around the half of $\bigwedge$.

FIG. 2D illustrates a schematic representation of example relationships between different properties of a DIL system (e.g., of FIG. 1) and the size ranges of the topographical features/arrays generated using the DIL system. Specifically, FIG. 2D illustrates the principles and/or relationships that govern the simultaneous generation of a wide spectrum of nanostructures (with varying properties) in a single laser exposure. Use of the curved mirror causes a constant change in the incident angle ($\theta$) leading to a continuous change of interference angle as well as the interferometric patterns that eventually produce nanostructures of differing properties (e.g., size). Moreover, the focal length of the curved mirror is proportional to the distance "d" between the location of nanostructures and the crossing points of mirror plane and substrate plane. As such, an increase of "d" in turn leads to a decrease in $\theta$ and/or $\bigwedge$. Alternatively and/or additionally, the angle $\beta$ may be varied to vary/control the speed of changes in $\theta$ and $\bigwedge$ when d changes along the substrate.

It should be noted that the above while the above equations define the formation of DIL patterns in accordance with certain assumptions, the disclosure is not so limiting. For example, different other complex arrays of topographic features may be generated that are not defined by the above equations. For example, when $\Psi 1$ and $\Psi 2$ are not assumed to be vertical to each other, a different interference pattern may be generated/tuned using the principles of this disclosure.

Figure 3A:
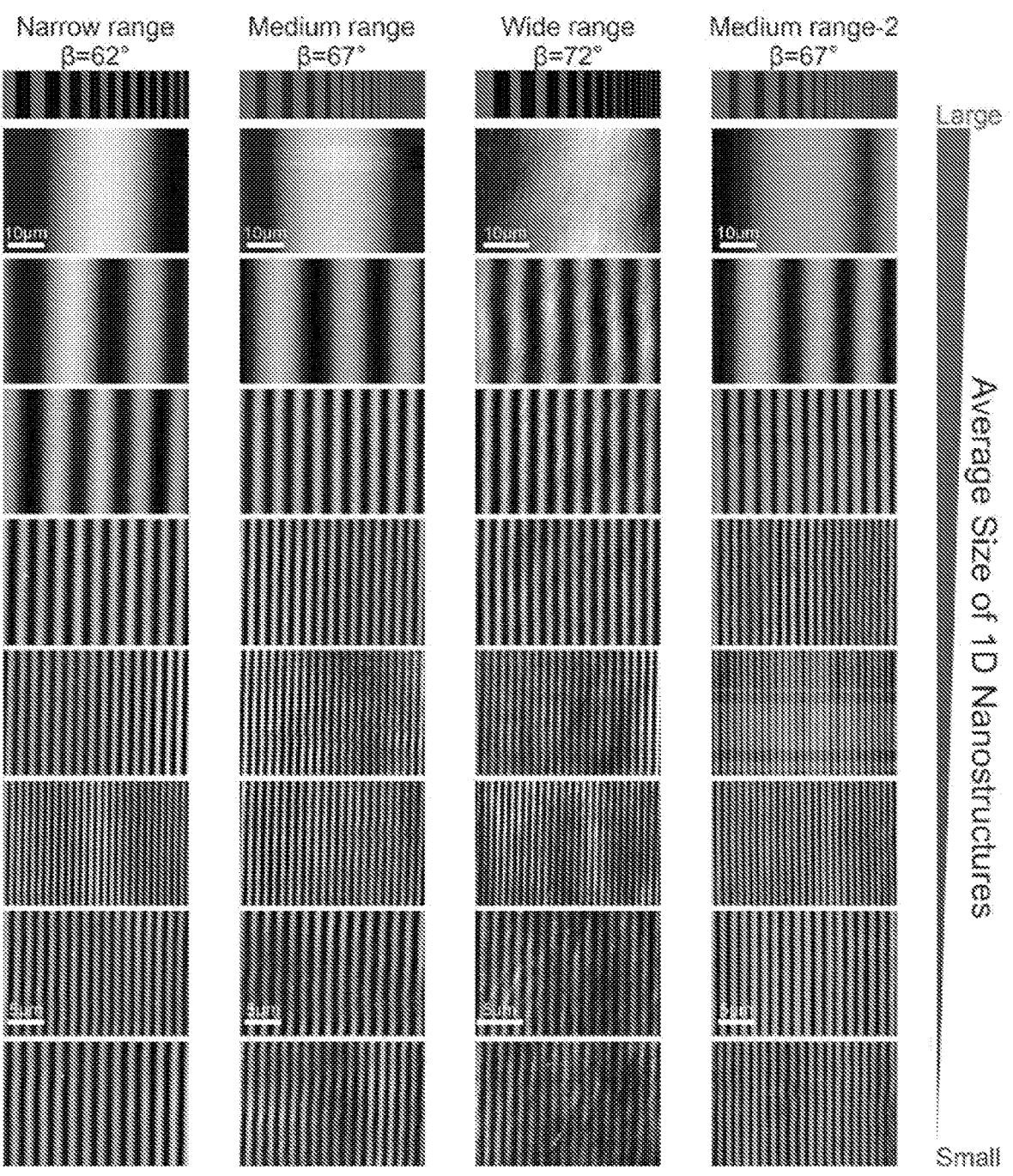
FIGS. 3A and 3B illustrates different example types of patterned structures formed using the DIL system of FIG. 1.
Figure 3B:
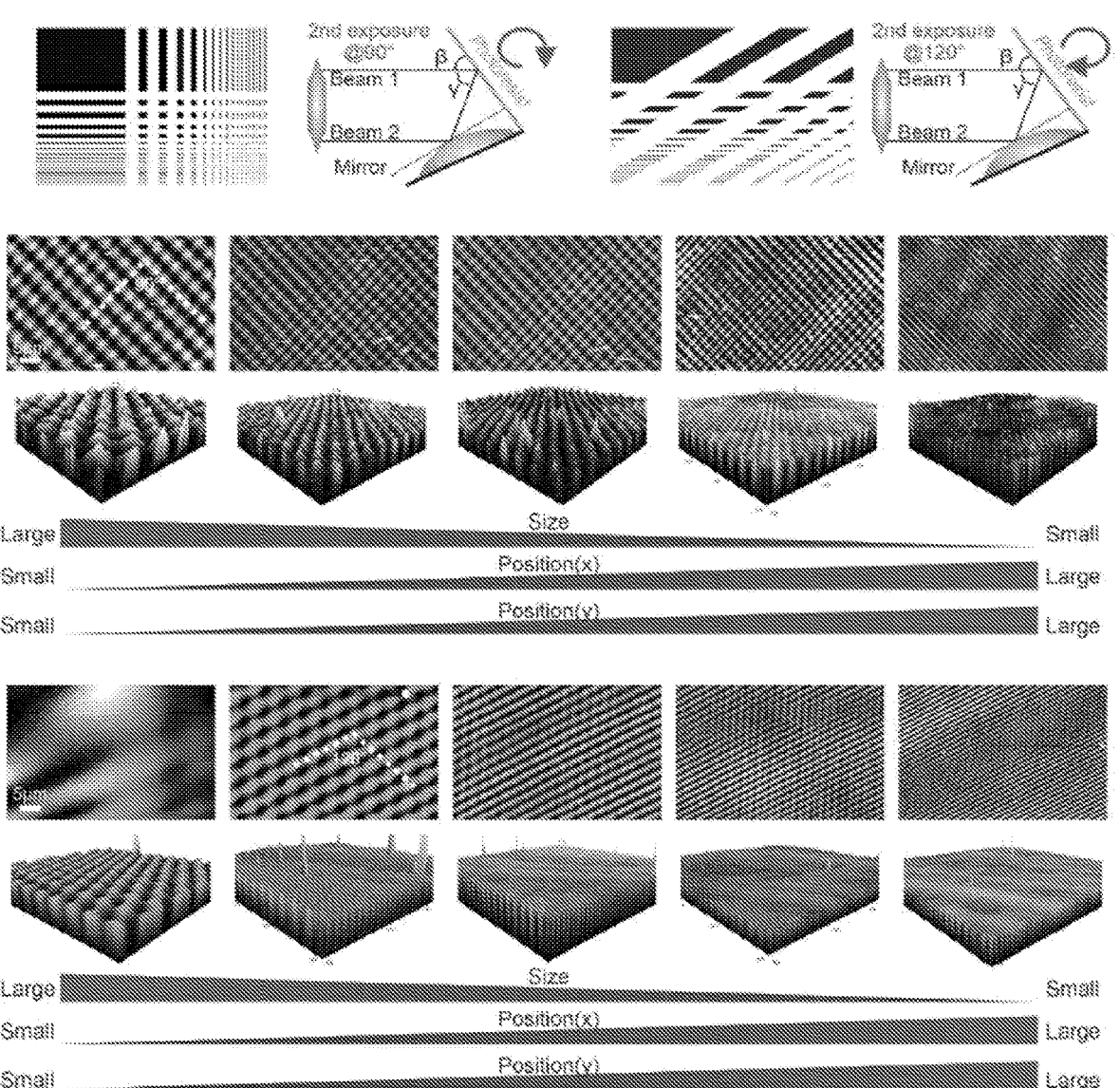

FIGS. 3A and 3B illustrates different types of patterned structures (with variations in size, shape, composition of the PR layer, orientation, etc.) formed on the substrate by varying the interference angle, focal length of the curved mirror, number of exposures, and the composition of the photoresist layer. Each column of images in FIG. 3A is a collection of atomic force microsopy images of nanostructures on one photoresist substrate after a single exposure using the DIL setup. Sizes and periods ($\wedge$) of nanostructures in each image decrease as the column goes from top to the bottom. The changes of nanostructure sizes indicate the alteration of $\theta$ depending on the location X2 where a light ray impinges upon the curved mirror. Each column of image sets is derived from a specific angle ($\beta$) between laser beams ($\omega1$) and the photoresist plane ($\Psi1$). As shown in FIG. 3A, an increase of $\beta$ leads to a more rapid change in the size of the formed topographical features. FIG. 3B illustrates the effect of the chosen rotation angle of the substrate between two laser exposures, which further determines the shape of the individual topographical features. For example, a 90° rotation of the substrate in between the two exposures results in grid or square shaped topographical features. A 120° rotation of the substrate in between the two exposures results in rhombus topographical features.

As discussed, the systems and methods of the current disclosure may be used to provide patterned surfaces including heterogeneous patterns or arrays formed from topographical features of different types, sizes, shapes, compositions, alignment, spacing, orientation, stiffness, or other properties (which are known to critically regulate mechanotransduction pathways), thereby providing a versatile platform to study and systematically screen biophysical cues for controlling cellular behavior. It is not intended that the patterned surface having the topographic patterns of the present disclosure be limited to a particular property. Rather, the compliance of the surface will be the factor determining the desired topography for a particular application (e.g. desired cell growth, desired cell self-renewal, desired cell differentiation, etc.). Furthermore, it should be noted that the diverse types of topographic structures on the patterned surfaces are indexable, and can be readily identified by their locations based on, for example, a series of quasi-exponential functions. For example, the curve describing the relationship between nanostructure sizes and positions may be plotted by manually measuring several nanostructure sizes using atomic force microscope at different positions. Then curve fitting functions may be used in, for example, Origin-Lab® for simulating the curve and deriving quasi-exponential functions. Therefore, specific biophysical cues can be tracked and correlated with their resulting cell behaviors, which is crucial for the automatic generation of biophysical cue maps.

In some embodiments, the surface chemistry of the patterned surfaces can be altered. For example, chemical bonding protocols which alter the surface chemistry of silicone and other substrata can be used to functionalize the desired surface in order to modulate cell attachment, growth, and differentiation. Functionalized surfaces could include attached molecules such as peptides, proteins, polynucleotides, polysaccharides, lipids, growth factors, and other bioactive agents. Various protocols known in the art can be used for functionalization of the surfaces. The protocols will vary according to the type of molecule that is being attached to the surface and the surface material used. Functionalization of the surfaces can be performed pre- and post-patterning.

Utility

The patterned surfaces, kits and methods of making the patterned surfaces using DIL find use in a variety of different applications where it is desirable to use different surface topographies on a single substrate. Examples include, for example, the study of the influence of surface topographies in a systematic fashion in the field of cell biology, where the objective is to examine how cells respond to different topographies such as lines, broken lines and dots or combinations thereof on microscopic to nanoscopic scales. Another example is the expanding field of plasmonics, where structures of different sizes and periodicities correspond to different resonance conditions. Furthermore, structures with biaxial periodicities enable cases where it is critical to implement different periodicities on the x- and y-axes therefore enabling two measurements on one sample by simply considering the polarization direction of the probing light. Exploiting biaxial periodicity by polarized light is especially applicable to surface enhanced Raman spectroscopy (SERS) whereby an active substrate with multiwavelength or tunable excitation can be created. Therefore, fabrication of structures with biaxial periodicity facilitates parallel experimentation, which reduces sample preparation time, decreases the number of independent experiments needed and enables rapid optimization of experimental conditions.

In cell biology applications, the patterned surfaces, kits and methods of this disclosure find use in cell culture applications for any type of cell to be cultured. For example, the patterned surfaces, kits and methods may be used to culture cells, such as, but not limited to, human and animal cell lines (e.g., aorta endothelial cells, neural cells, mesenchymal stem cells, and the like). The fabrication of different topographies on a single substrate surface may be used for fast and efficient experimental studies investigating the effect of different surface topographies on a wide range of cell types. The disclosed process can also be used for fast microscopy screening for cell-topography interactions, for immunotherapy and cancer diagnostic applications, therapeutic applications, pharmaceutical compositions, and immunotherapy applications.

The methods described herein additionally find use in producing patterned surfaces for cell culturing, for example on substrates such as, but not limited to, glass, polystyrene, and other types of surfaces. The methods also find use in the production of patterned surfaces where clean-room facilities and harsh chemicals that may be harmful to cells are not required. For example, embodiments of certain methods for the production of the patterned surfaces may not use toxic compounds or chemicals that may inhibit or prevent cell growth and/or maintenance on the patterned surface. The methods described herein find use in the efficient production of patterned surfaces at a low cost. In addition, the methods described herein find use in the production of patterned surfaces that are stable during long-term storage of the patterned surfaces before use.

Embodiments of the patterned surfaces, kits and methods of the current disclosure also find use in long-term patterned cell culture and study, for example, in the study of cell differentiation over time. The presently disclosed patterned surfaces and kits provide patterned surfaces that are biocompatible and chemically stable, such that patterned cell cultures may be maintained on the patterned surfaces for extended periods of time, e.g., 1 week or more, such as 2 weeks or more, including 3 weeks or more, or 4 weeks or more, or several months or more (e.g., 2 months, 3 months, 4 months, 5 months, 6 months, or 9 months, or 12 months or more).

The patterned surfaces, kits and methods of making the patterned surfaces of the current disclosure also find use in biomedical devices. For example, single-patterned surfaces can be used in biomedical devices for single cell detection, 2D and 3D tissue printing for artificial organ reconstruction where a wide range of cell culture pattern shapes and sizes may be desired, and the like. In addition, embodiments of the patterned surfaces, kits and methods also find use in tissue regeneration applications, where single-cell cultures are desired. Single-patterned surfaces also find use in applications where it is desirable to minimize cell-to-cell interactions. For instance, single patterned surfaces may be used to study individual cell characteristics, for testing the effects of compounds (e.g., drugs, etc.) on individual cells, and the like.

Advantageously, the disclosed process may be highly reproducible and may be used to simultaneously fabricate a large range of different topographies, such as different heights, dimensions and feature shapes onto a single substrate surface. Advantageously, the method described herein provides a low cost fabrication process. In particular, nanoimprint technology, which is a cost-efficient, scalable, high throughput nanoimprinting technique, is used to create the different topographies which are otherwise prohibitively expensive. It should be noted that topographical arrays produced using the current disclosure have minimal variations between topographical features of same sizes/types (on same substrate or between different substrates of same type) because the arrays are formed at identical conditions in the same substrate. The large number of nanostructures compared in parallel also allows for unbiased screening and big data analysis for a more precise and reproducible prediction of most optimal nanostructures in different types of applications.

Predictive Biophysical Cue Mapping

Figure 4:
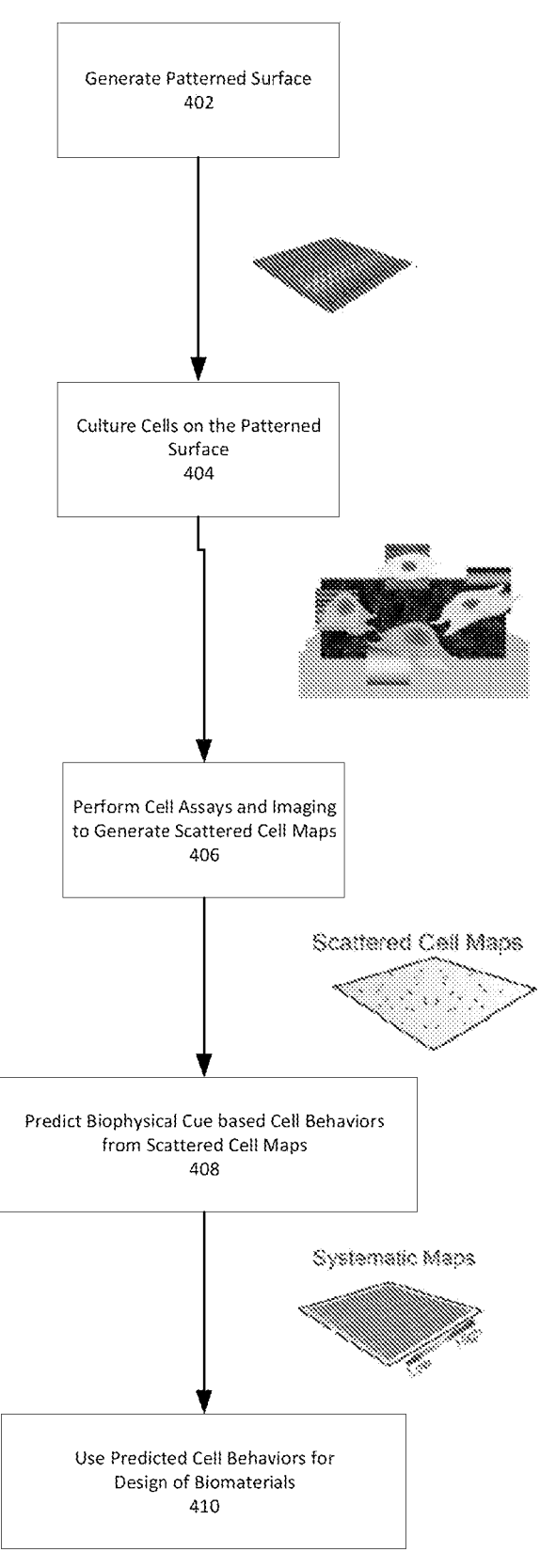
FIG. 4 illustrates an example schematic flowchart of performing predictive biophysical cue mapping using the patterned surfaces of this disclosure.

This disclosure further provides a predictive cell mapping platform to systematically investigate cell-ECM interactions. The methods may include integrating high content cell imaging and machine learning-based big data analytics into the patterned surface-based high throughput cell screening. The current disclosure provides a platform to explore a broad spectrum of complex material structures that commonly exist in natural ECMs. The quantitative maps for ECM-directed cell behavior control represent an advancement in high throughput cell screening to guide the design of clinically relevant biomaterials and facilitate the mechanistic understanding of biophysical signaling. FIG. 4 illustrates an example schematic flowchart of performing predictive biophysical cue mapping.

The predictive biophysical cue mapping may include generation (402) of a patterned surface including nanoarrays (i.e., topographical patterns) that may be used as a substrate for cell culture (e.g., stem cell culture) for predicting ECM-directed cell behaviors and studying the corresponding biophysical signaling pathways (as discussed above). Specifically, biophysical cues in the forms of dots (0-D), lines (1-D), grids (2-D), and hierarchical micro/nano-structures having different properties such as sizes, shapes, stiffness, compositions, etc. that are commonly observed in natural ECM structures may be precisely fabricated using the systems and methods discussed above. Furthermore, the locations of different types of topographical features on the array substrate are indexed.

Next, cells may be cultured on the generated substrate (404), and the resulting cell behavior may be assayed, visualized, and/or otherwise recorded using any now or hereafter known techniques (406). Examples of such techniques may include, without limitation, high throughput screening (HTS) cellular assays, high-content screening (HCS), high content imaging (HCI) of biomarkers, quantitative cell analysis, or the like. For example, HTS/HCS cell assays may be performed on the array as an initial step, followed by visualization of diverse topography-mediated cell-ECM interactions using HCI of biomarkers (e.g., actin for adhesion and TuJ1 for differentiation and axonal growth). Optionally, image discretization may be performed to create, for example, discrete cell-clusters and/or meshes where cell behaviors can be correlated to specific biophysical cues (i.e., the topographical feature locations) on the array to generate cell behavior maps. Specifically, cell-ECM interactions are analyzed in a spatiotemporally resolved manner for enabling tracking and correlation of thousands of different biophysical cues with the corresponding cell behaviors and yield a quantitative map of cell behaviors (e.g., a scattered cell behavior map) with respect to the indexed topographical features on the array (406). In other words, the observed cell behaviors are correlated to the location and properties of the topographical features on the substrate array to generate a map of cell behaviors.

In various embodiments, the resolution of the generated maps of cell behaviors may be improved to improve precision and analysis of biophysical cue based cell cellular behavior. For example, machine learning methods such as Gaussian process regression (GPR) may be used to analyze the large amounts of data in the generated cell behavior maps to predict cell-ECM interactions beyond those actually observed on the array (408). This enables generation of quantitative radar charts, systematic maps, etc., from the biophysical cue maps and assessment of a wide range of biophysical cue-regulated cell behaviors in a systematic manner for use in other applications (e.g., immunotherapy and cancer diagnostic applications, therapeutic applications, pharmaceutical compositions, and immunotherapy applications, etc.).

For example, the map of cell behaviors, the radar charts, the systematic maps, etc. may be used in stem cell-based tissue engineering for the design and synthesis of functional biomaterials such as nanofiber scaffolds for personalized cell therapy (410). Specifically, information related to biophysical cue mediated cell behavior from the map of cell behaviors, the radar charts, the systematic maps, etc. (relating to one or more types of cells, cells obtained from different individuals, etc.) may be used as feedback for rational design and generation of functional biomaterials or substrates such as nanofiber scaffolds (using the systems and methods discussed above and/or any other now or hereafter known techniques) that provide specific desired cues for modulating cell behavior for a particular application (e.g., for personalized cell therapy).

Kits

Also provided are kits for use in practicing the methods. The kits include a patterned surface, e.g., as described above. In certain embodiments, the kits also include a proteinaceous cell-binding agent, such as, but not limited to, fibronectin, serum, and the like. In some instances, the kits may include cells for applying to the cell culture substrate. The kit components may be present in separate containers. Alternatively, the components may be present as a packaged element that includes one or more kit components, such as those described above.

In certain embodiments, the kits include additional reagents and/or solutions. The reagents and/or solutions may be used in the cell culture, for example, phosphate-buffered saline (PBS), a surfactant, an antibiotic, a cell culture medium, a fluorescent labeling solution, and the like. As described above, the additional reagents and/or solutions may be provided in separate containers, or as components in a packaged kit.

In addition to above-mentioned components, the kits may further include instructions for using the components of the kit to practice the methods. The instructions for practicing the methods are generally recorded on a suitable recording medium. For example, the instructions may be printed on a substrate, such as paper or plastic, etc. As such, the instructions may be present in the kits as a package insert, in the labeling of the container of the kit or components thereof (i.e., associated with the packaging or sub-packaging), etc. In other embodiments, the instructions are present as an electronically stored data file present on a suitable computer readable storage medium, e.g., CD, DVD, Blu-ray, flash memory, etc. In yet other embodiments, the actual instructions are not present in the kit, but means for obtaining the instructions from a remote source, e.g., via the internet, are provided. An example of this embodiment is a kit that includes a web address where the instructions can be viewed and/or from which the instructions can be downloaded. As with the instructions, this means for obtaining the instructions is recorded.

EXAMPLES

It should be noted that cell culturing on the patterned surfaces of the current disclosure can be done according to standard procedures known in the art. One skilled in the art will know that different types of culture media can be used for different applications. For example, if the objective is to promote cell differentiation, the culture medium can be modified to contain compounds that promote differentiation; if the objective is to promote cell self-renewal, the culture medium can be modified to contain compounds that promote cell self-renewal.

Other parameters that influence cell culture in vitro can also be used to induce or promote cell behavior as desired. These include environmental parameters such as temperature, pressure, etc.

It is not intended that the present disclosure be limited for culturing particular type of cells (or merely one cell type on surface). A variety of cell types (including mixtures of different cells) are contemplated. Indeed, any type of cell grown in vitro can be grown on the patterned surfaces. The cells could be undifferentiated cells from any mammal such as mesenchymal stem cells, embryonic stem cells, pluripotent stem cells, or the like. In one embodiment, the cells secrete a medically useful compound (e.g., hormone, cytokine, etc.). Such cells may be (but need not be) cells that have been manipulated by recombinant means to secrete such compounds.

Assaying of the cell behavior is performed using standard assays that measure cell behavior, such as adhesion, cell growth, proliferation, migration, self-renewal, etc. Some of these techniques are described in the examples section below. Generally, what is important is a direct comparison of the cell behavior when cells are cultured on the patterned surface of this disclosure with the behavior of cells that are cultured on a flat surface.

The following examples are put forth so as to provide those of ordinary skill in the art with a complete disclosure and description of how to make and use the embodiments of the disclosure, and are not intended to limit the scope of disclosure nor are they intended to represent that the experiments below are all or the only experiments performed.

Example 1: Predictive Biophysical Cue Mapping

Three representative neural stem cell (NSC) types [human-induced pluripotent stem cell-derived neural stem cells (normal, healthy hiPSC-NSCs) and autism patient-derived hiPSC-NSCs (patient-hiPSC-NSCs), and adult human NSCs (adult hNSCs) harvested from human hippocampus] were utilized to investigate how diverse patient cells differentially respond to biophysical cues and direct NSC fate and neuronal behavior. For investigating cell-type-specific modulation of hiPSC-NSC behaviors using the patterned surfaces of the current disclosure, five key cell behaviors (adhesion, proliferation, differentiation of NSCs, and axonal growth, and axonal alignment of differentiated neurons) were mapped for hiPSCs, patient-hiPSC-NSCs, and adult NSCs.

Human-induced pluripotent stem cells (hiPSCs) can be generated from patients having neurological disorders (e.g. autism and Parkinson's disease) to present the mechanistic profiles during patient genotypic and phenotypic changes associated with these diseases. Specifically, hiPSC-NSCs provide an excellent platform that closely mimics the human brain and central nervous system (CNS) for disease modeling and drug screening. Studying the specific biophysical cue-directed differentiation of hiPSC-NSCs into specific neural cell lineages and mature neural networks can, therefore, provide insights into developmental biology as well as the detailed progression of neurodegenerative diseases.

Fabrication of Patterned Surface

This example illustrates a process of the present disclosure for fabricating an array or patterned surface in accordance with the present disclosure and using the system described in FIG. 1.

First the substrate was prepared for dynamic interference lithography. Specifically, a 0.5 mm thick glass slide with an active patterning area of 1×1 cm$^2$ was sequentially sonicated in 1% Triton X-100 [4-(C8H17)C6H4OCH2CH2·nOH), n~10, Sigma Aldrich], ethanol (95%) and deionized water 20 minutes each for cleaning followed drying using N$_2$ gas. The glass slide was then functionalized with (CH$_3$)$_3$SiNHSi (CH$_3$)$_3$ [hexamethyldisilazane (HMDS), Sigma Aldrich] via a vapor phase deposition method in a vacuum chamber and then spin coated (Laurell Technologies, USA) AZ2020, with a UV-cross-linkable photoresist (PR) after 1:0.8 dilution with an AZ EBR solvent (Microchemicals, Germany). After soft baking at 120° C. for 60 s, the PR-coated glass was exposed to interferometry coupled with a UV laser (He—Cd 325 nm laser, KIMMON KOHA Laser Systems, Japan) at the wavelength of 325 nm and a power density of 0.8 mW/cm$^2$.

A patterned surface with combinatorial nanoarrays of various topographical features was then generated by exposing the PR-coated surface to laser beams using the system of FIG. 1. Various parameters (e.g., curved mirror properties, angle of incidence, number of exposures, etc.) were modulated to control the topographical features formed on the differentially structured substrate (as discussed above). After the exposure, the PR-coated substrate was baked at 120° C. for one minute, and then etched by a developer solvent in order to remove uncrosslinked PR.

The topographical features of the patterned surface were characterized by performing optical (phase image collected by a T2500 inverted fluorescence microscope), Field-Emission Scanning Electron Microscope (FESEM, Zeiss 982, 20 kV), Helium-ion Microscopy (HIM, Carl Zeiss, Orion Plus)

and Atomic Force Microscope (AFM, Park Systems, NX10 series) on the combinatorial nanoarrays. In the AFM experiment, tapping mode was used and XYZ positioning was controlled by piezoelectric scanners. Table 1 below illustrates the controlled fabrication of different types of topographical features on PR-coated substrates by modulating various parameters.

Stem Cell Culture

The patterned surfaces were coated with gelatin (e.g., Matrigel for two hours) prior to serving as substrates for cell culture. Stem cells were seeded onto the coated patterned surface with topographical features in growth media to allow them to stabilize and adhere to the substrate, and subsequent differentiation was initiated by, for example, FGF2 withdrawal in the growth media.

TABLE 1

| | DIL-1 | DIL-2 | DIL-3 | DIL-4 | DIL-5 | DIL-6 | DIL-7 |
|---|---|---|---|---|---|---|---|
| Curved Mirror | Convex | Convex | Convex | Convex | Convex | Convex | Concave |
| Angle β | 51° | 57° | 69° | 72° | 69° | 69° | 69° |
| Focal length of curved mirror | 5 mm | 5 mm | 5 mm | 5 mm | 15 mm | 5 mm | 5 mm |
| Composition of PR | AZ 2020 | AZ 2020 | AZ 2020 | AZ 2020 | AZ 2020 | PDMS | Phenolic resin |
| Spin-coating parameters | 4000 rpm 30 s | 4000 rpm 30 s | 4000 rpm 30 s | 4000 rpm 30 s | 4000 rpm 30 s | 4000 rpm 30 s | 5000 rpm 15 s |
| Exposure time | 30 s | 30 s | 30 s | 30 s | 30 s | 30 s | 30 s |
| Rotation | N.A. | N.A. | N.A. | N.A. | N.A. | N.A. | N.A. |
| Baking condition | Prebake (100° C.) 60 s Postbake 70 s (120° C.) | | | | | | Prebake |
| Developing time | 8 s | 8 s | 8 s | 8 s | 8 s | 8 s | 5 s |
| Molding | N.A. | N.A. | N.A. | N.A. | N.A. | PDMS | N.A. |
| Estimated number of structures | 10000-20000 | 10000-20000 | 10000-20000 | 10000-20000 | 10000-20000 | 10000-20000 | 10000-20000 |
| Structural ranges | Lines | Lines | Lines | Lines | Lines | Lines | Lines |
| Speed of size change | Fast —> Slow | | | | | | |

| | DIL-7 | DIL-9 | DIL-10 | DIL-11 | DIL-12 |
|---|---|---|---|---|---|
| Curved Mirror | Convex/or Convex etc | Convex/or Convex etc | Convex/or Convex etc | Convex/or Convex etc | Planar |
| Angle β | 51° | 51° | 57° | 69° | 72° |
| Focal length of curved mirror | 5 mm | 0 mm | 0 mm | 0 mm | 0 mm |
| Composition of PR | AZ 2020 | AZ 2020 | AZ 2020 | AZ 2020 | AZ 2020 |
| Spin-coating parameters | 4000 rpm 30 s | 4000 rpm 30 s | 4000 rpm 30 s | 4000 rpm 30 s | 4000 rpm 30 s |
| Exposure time | 20 s | 20 s | 20 s | 20 s | 20 s |
| Rotation | 120° | 90° | 90° | 90° | 90° |
| Baking condition | Prebake (100° C.) 60 s Postbake 70 s (120° C.) | | | | |
| Developing time | 10 s | 10 s | 10 s | 10 s | 10 s |
| Molding | N.A. | N.A. | N.A. | N.A. | N.A. |
| Estimated number of structures | 0.8-3 million | 10000-20000 | 1-4 million | 1-4 million | 1-4 million |
| Structural ranges | 120° grids | Vertical | Vertical | Vertical | Vertical grids |
| Speed of size change | Fast —> Slow | | | | |

Figure 5:
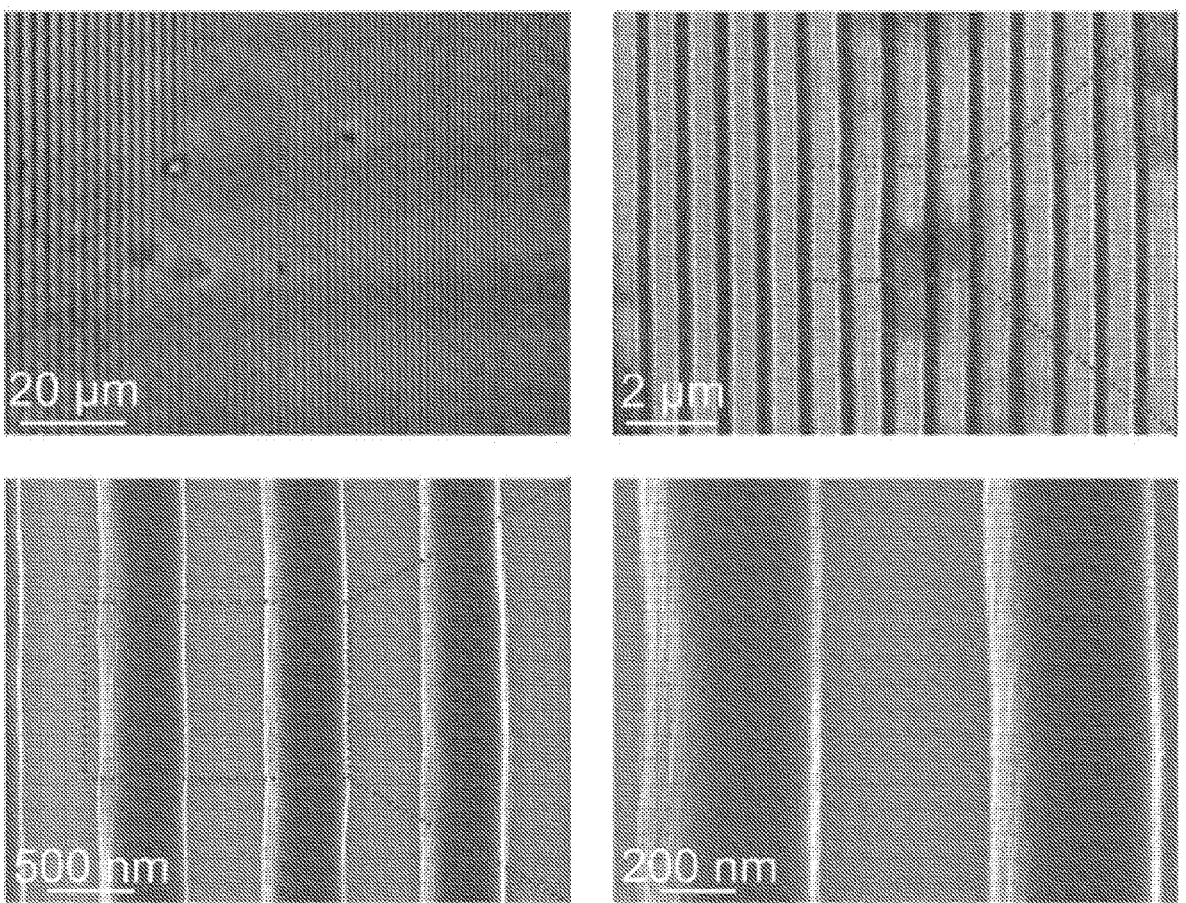
FIG. 5 illustrates representative helium ion microscopy images showing the zoomed-in views of the topographic features on a patterned surface of this disclosure.

FIG. 5 illustrates representative helium ion microscopy images showing the zoomed-in views of the topographic features on a patterned surface formed using the above methods, and confirm the high precision of dynamic interference lithography using a curved mirror in fabricating nanoarrays on a surface.

The human neural stem cell [RenCell, Millipore (SCC008)] line was cultured based on the manufacturer's protocol. Specifically, 25 cm² tissue culture plates (with the patterned surface) were coated with Matrigel (Corning) for two hours at 37° C., then one million RenCell were seeded and cultured in a humidified incubator with 5% $CO_2$. Cells with passage number between seven to ten were selected for experimentation. Growth media for RenCell contained 0.5% $N_2$, 0.5% B27, 20 ng/mL basic fibroblast growth factor (bFGF), and 20 ng/mL epidermal growth factor (EGF) dissolved in DMEM:F12 basal media. The differentiation of RenCell was initiated by withdrawal of FGF2 in the growth media.

hiPSC-NSC-WT and hiPSC-NSC-Q83 were derived from WT fibroblast and RTT fibroblast (WT126 clone 8; and WT33 clone 1) respectively, using known protocols. hiPSC-NSCs were expanded in a proliferation media containing DMEM/F12 with Glutamax (Invitrogen), B27-supplement (Invitrogen), N2 (Stem Cells), and 20 ng/mL FGF2 (Invitrogen). The differentiation of hiPSC-NSC-WT and hiPSC-NSC-Q83 was initiated by withdrawal of FGF2 in the growth media. Tissue culture vessels were treated with Matrigel (Corning) 1:200 dilution with DMEM (Invitrogen) at 37° C. for one hour. Media was changed twice daily during growth and differentiation.

BJ fibroblast cell line was purchased from ATCC® and harvested from the foreskin of newborn male human. Passage 4-7 were used throughout the experiments. 20% FBS with DMEM as the basal media was used for maintaining and expanding the cell line. Neuronal reprogramming media was formulated to include: B27, $N_2$, Glutamax, bFGF (100 ng/mL), ISX9 (20 µM), Forskolin (100 µM), Chir99021 (20 µM) and dCAMP (100 ng/mL) with basal media composed of neurobasal and DMEM/F12 media at a 1:1 ratio.

Table 2 below illustrates different media formulations for cell culture:

cytoskeletal markers (Actin) and neuronal markers (TuJ1) were performed to obtain the adhesion and axonal growth maps.

In the stem cell proliferation screening, stem cells were first labelled with CFSE dye (dilution 1:1000, Thermo Fisher) using known protocols and then seeded onto the patterned surfaces followed by continuous culture in growth media for 5 days. Cells were then fixed and stained with nuclear marker DAPI (Thermo Fisher). Based on the ratio of the fluorescent intensities between CFSE and DAPI, the relative proliferation rate for the stem cells were quantified.

Specifically, all fluorescence images were obtained using a Nikon T2500 inverted fluorescence microscope. The nucleus was stained with DAPI (1:500 dilution, Life Technologies) for 30 minutes and then washed with PBS three times. Cells were permeabilized with 0.1% Triton X-100 in PBS for 10 minutes and non-specific binding was blocked with 5% normal goat serum (NGS, Life Technologies) in DPBS for 1 hr at room temperature. In the differentiation and axonal growth assay, cells were stained with neuronal markers TuJ1, and MAP2 were stained using the mouse monoclonal antibody against TuJ1 (1:200 dilution, Biolegend) and MAP2 (1:300 dilution, Cell Signaling). After incubating overnight at 4° C. in a solution of these antibodies in PBS containing 10% NGS and washing three times with PBS, the samples were incubated for 1 hour at room temperature in a solution of anti-mouse secondary antibody labeled with Alexa Flour 568 (1:100, Life Technologies) in PBS containing 10% NGS, and washed with DPBS three times thereafter. In the adhesion assay, cells were stained

TABLE 2

| Substrate coating | RenCell Laminin (Sigma Millipore CC095) | hiPSC-NSC-Laminin (Sigma Millipore CC095)/Matrigel (Corning) | hiPSC-Fibroblast Matrigel (Sigma Millipore DLW354263) |
|---|---|---|---|
| Proliferation media | Neural basal medium (Gibco) and DMEM/F12 (Gibco) (50:50 ratio) | DMEM/F12 with Glutamax (Invitrogen), B27-supplement (Invitrogen), N2 (Stem | 10% FBS in DMEM (Thermo Fisher) |
| Differentiation media | Neural basal medium (Gibco) and DMEM/F12 (Gibco) (50:50 ratio) supplemented with 0.5% N2 (Gibco), 0.5% B27 | DMEM/F12 with Glutamax (Invitrogen), B27- supplement (Invitrogen), N2 (Stem Cells) | B27, N2, Glutamax, bFGF (100 ng/mL), ISX9 (20 µM), Forskolin (100 µM), Chir99021 (20 µM) and dCAMP (100 ng/mL) with basal media composed of neurobasal and DMEM/F12 media at a 1:1 ratio |

Cell Behavior Screening

To perform stem cell differentiation screening, glass slides with patterned surfaces (e.g., the 1D combinatorial nanoarrays of DIL-3 in TABLE 1) were placed in 24-well plates, and each well was seeded with stem cells ((hiPSC-NSCs and adult-NSCs) at a cell density of 40,000 cells per $cm^2$. The patterned surface was coated with Matrigel for two hours prior to the cell seeding. Stem cells were seeded in growth media for four hours to allow them to stabilize and adhere to the substrate, followed by differentiation initiation upon FGF2 withdrawal in the growth media. After 7 days, cells on the patterned surfaces in the wells were fixed and immunostaining on neuronal markers (TuJ1 and MAP2) was performed to obtain the neuronal differentiation and axonal alignment maps.

For the adhesion, proliferation and axonal growth screening, lower cell densities at 10,000 cells per $cm^2$ were seeded on patterned surfaces to minimize complicated effects from cell-cell interactions. Cells were fixed 12-hours and 7-days after seeding for the adhesion screening and axonal growth screening, respectively. Afterwards, immunostaining on with TRITC-labelled Phalloidin (1:100 dilution, ThermoFisher) and DAPI (1:500 dilution, Life Technologies) for one hour followed by DPBS washing. In the cell survival screening, live-dead kits (ThermoFisher, L3224) were used following the protocol from vendor. Briefly, we incubated cells with 1 µM calcein (green, live cell) and Ethidium homodimer-1 (red, dead cell) in the growth media for ten minutes and then imaged the large-scale substrates immediately.

Mapping Cell-Matrix Interactions Based on Cell Screening Results

In the stem cell adhesion screening, cytoskeletal structures of cells were stained with TRITC-labelled phalloidin across the large-scale substrate. Then the substrates were imaged by a Nikon T2500 inverted fluorescence microscope or ZEISS LSM 800 confocal microscope using automatic acquisition and stitching functions. Based on the stitched images, CellProfiler pipelines were built to automatically identify fluorescent objects within size ranges between 8 to 80 pixels (0.65 µm per pixel). Using this automatic approach, over 10,000 objects (cells) encoded with quantitative values of position, cell area, cell circularity, long axis length, short axis length etc. were identified. Cell spreading was evaluated by the parameter of cell area. By creating a function between cell spreading (Z) and position (X, Y) for each specific object using OriginLab or MATLAB, the quantitative 3D contour map visualizing the cell spreading and adhesion was generated. Similarly, based on the reverse of cell circularity, a 3D contour map visualizing the cell polarization was created. On these maps, functional relationship between cell behaviors and 3D material structures were established by correlating the cell behaviors of individual cells to the topographies at each specific position.

In the stem cell differentiation screening, cells differentiated for 7 days were stained with mature neuronal marker MAP2 and imaged using the fluorescent microscope. The homogenous cell densities were confirmed based on the nuclear staining (DAPI), followed by removal of large-scale stitched images with illumination fluorescent background and pixelization into 48 to 576 arrays of smaller image files using the Nikon MS Element software package. Automatic batch analysis on the fluorescent intensities of these pixelized images was performed in the Batch process functions in ImageJ. By establishing the function between the fluorescent intensities (Z) and the position (X, Y) of each pixelized array, contour maps visualizing neuronal differentiation were generated.

To analyze the stem cell differentiation results on the aligned nanofibers, the Orientation J plugin in the Image J software package was used. In the study on the neuronal differentiation from individual substrates, cells were stained with neuronal markers such as TuJ1, MAP2, NeuN and nuclear marker (DAPI) followed by automatic detection of neuronal morphology using ImageJ or Nikon Ti Element software. The percentage of neurons, intensity of neuronal marker expression, or the axonal lengths were then quantified. These studies on individual substrates included the neuronal differentiation from RenCell and hiPSC-derived NSCs on the line structures generated by conventional Lloyd's interferometer lithography, and the neuronal reprogramming from BJ fibroblast on the hierarchical structures synthesized by combined Lloyd's interferometer and photomask lithography.

NeuronJ plugin in the ImageJ software package were used to create axonal growth map from the stem cell differentiation screening. In the large-scale stitched neuronal differentiation images, axons are stained by the red color from the immunostaining on TuJ1 neuronal marker. Based on the immunostaining image, NeuronJ plugin was used to trace out individual axons, for calculation of the length for each neuron. Position (X, Y) of starting point at each axonal tracing was recorded to correlate with substrate topographies. Axons that entangled each other or covered different ranges of topographies were not included in the analysis. By creating a function between axonal length (Z) and position (X, Y), 3D contour maps visualizing topographies-directed axonal growth were generated.

For the cell proliferation map, cells were stained with CellTrace™ CFSE kit following the protocols from the ThermoFisher prior to their seeding onto the combinatorial nanoarray. After three days' proliferation in growth media (with bFGF for hiPSC-derived cell culture and bFGF/EGF for RenCell culture), cells were fixed and stained with DAPI. Nikon MS Ti Series microscope was used to image the substrate using a Stitch function followed by illumination background removal. A CellProfiler pipeline used for the identification of cell shapes mentioned above was applied for the automatic identification of cells and quantification of fluorescent intensity from CFSE. By generating a function between the fluorescent intensities (Z) and position (X, Y) of each individual object (cell) identified by Cell-Profiler, contour maps visualizing the proliferation were then generated.

Machine Learning on the Mapped Results

A supervised GPR machine learning (GPR-ML) model, generated in MATLAB R2019b, was adopted to the current disclosure to continuously predict the spatial arrangement of cells when subjected to various regimes of the patterned surface. The dataset was preprocessed by combining the x and y spatial coordinates of each individual cell and/or cell clusters into an observation matrix while placing the corresponding z-coordinate into a label vector where the indices of the observation matrix and the label vector were consistent with one another. After separating the observations from the labels, the hyperparameters where optimized using a Bayesian optimizer to ensure the learning process was updated and modified at each new evaluation of the model. An expected improvement (EI) criterion for the acquisition function was utilized to evaluate regions where the model believed the objection function was low as well as regions where the uncertainty was high to address exploitation verse exploration tradeoff such that it was possible to search local areas within the bounds of the optimizer without overexploiting one area and being trapped in a local minimum. After establishing the optimizer, the observation data was split into 90% training and 10% testing data to allow for hold out cross-validation to determine the model's predictive accuracy. After generating the GPR-ML model, the maximum and minimum values of the x and y coordinates where identified and placed into 2-D grid composed of 250,000 values that spanned the area bounded by the maxima and minima to serve as inputs. Finally, this matrix was given to the GPR-ML model to predict the corresponding z-coordinate.

Figures 6A, 6B, 6C:
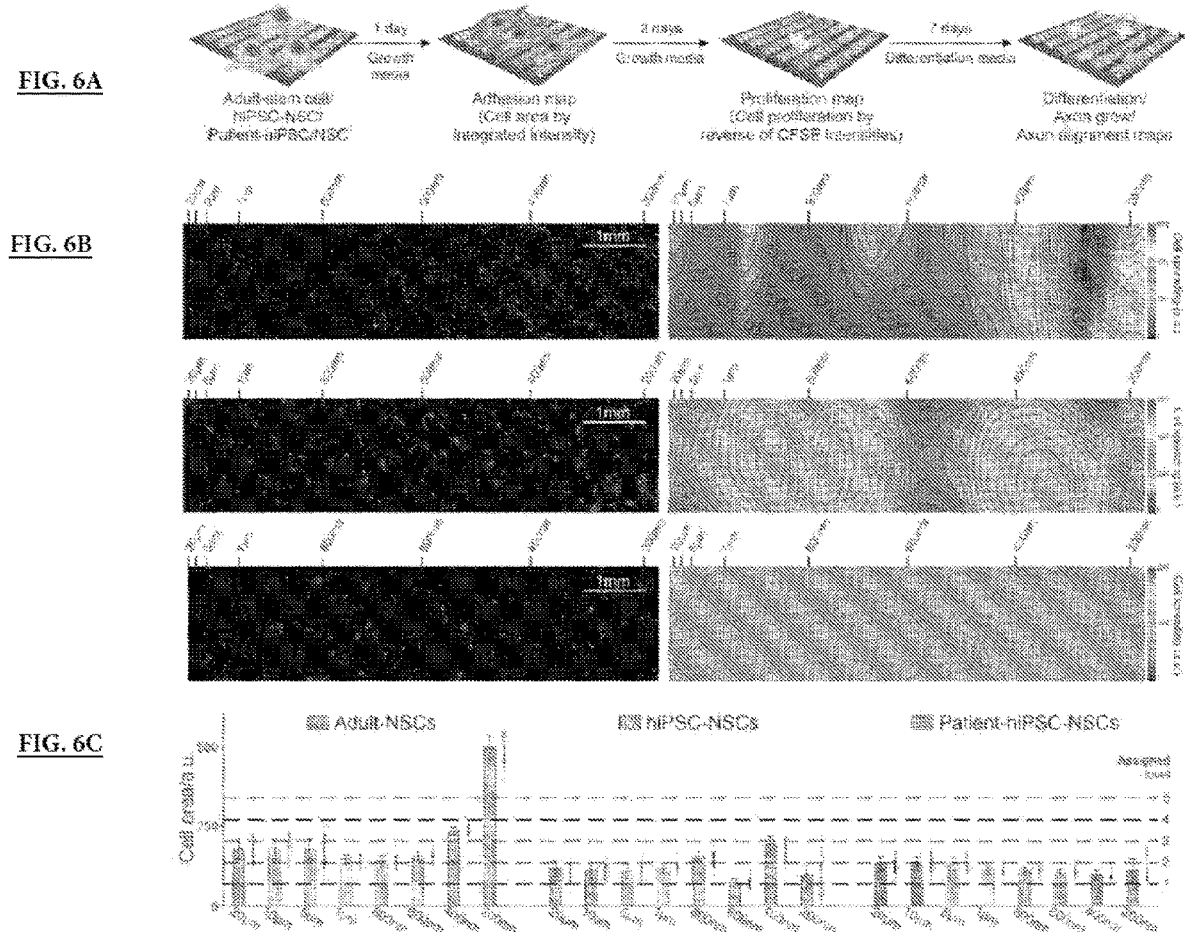
FIG. 6A illustrates a schematic illustration of patterned surface nanoarray-based neuronal adhesion assay.
FIG. 6B illustrates the generated adhesion maps for adult-NSC, hiPSC-NSC and hiPSC-NSC-Q83.
FIG. 6C illustrates the quantifications at representative biophysical cues.

FIG. 6A illustrates a schematic illustration of patterned surface nanoarray-based neuronal adhesion assay; FIG. 6B illustrates the generated adhesion maps for adult-NSC, hiPSC-NSC and hiPSC-NSC-Q83; and FIG. 6C illustrates the quantifications at representative biophysical cues (i.e., sizes of the 1D line nanostructures).

Figures 7A, 7B, 7C:
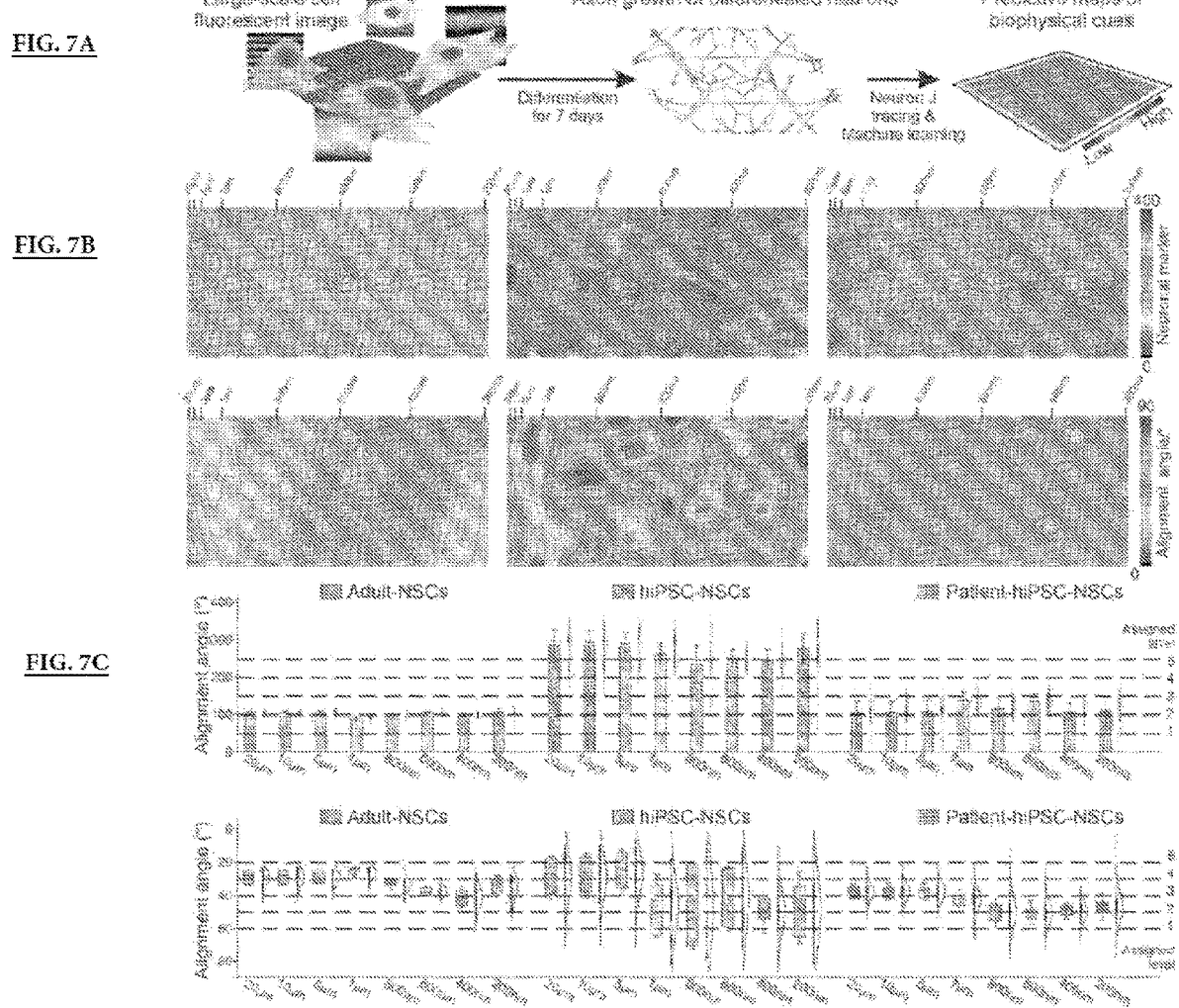
FIG. 7A illustrates a schematic illustration of patterned surface nanoarray-based neuronal differentiation and axonal alignment assay.
FIG. 7B illustrates the generated differentiation and axonal alignment maps for adult-NSC, hiPSC-NSC and hiPSC-NSC-Q83.
FIG. 7C illustrates the quantifications at representative biophysical cues.

FIG. 7A illustrates a schematic illustration of patterned surface nanoarray-based neuronal differentiation and axonal alignment assay; FIG. 7B illustrates the generated differentiation and axonal alignment maps for adult-NSC, hiPSC-NSC and hiPSC-NSC-Q83; and FIG. 7C illustrates the quantifications at representative biophysical cues (i.e., sizes of the 1D line nanostructures).

Figures 8A, 8B, 8C:
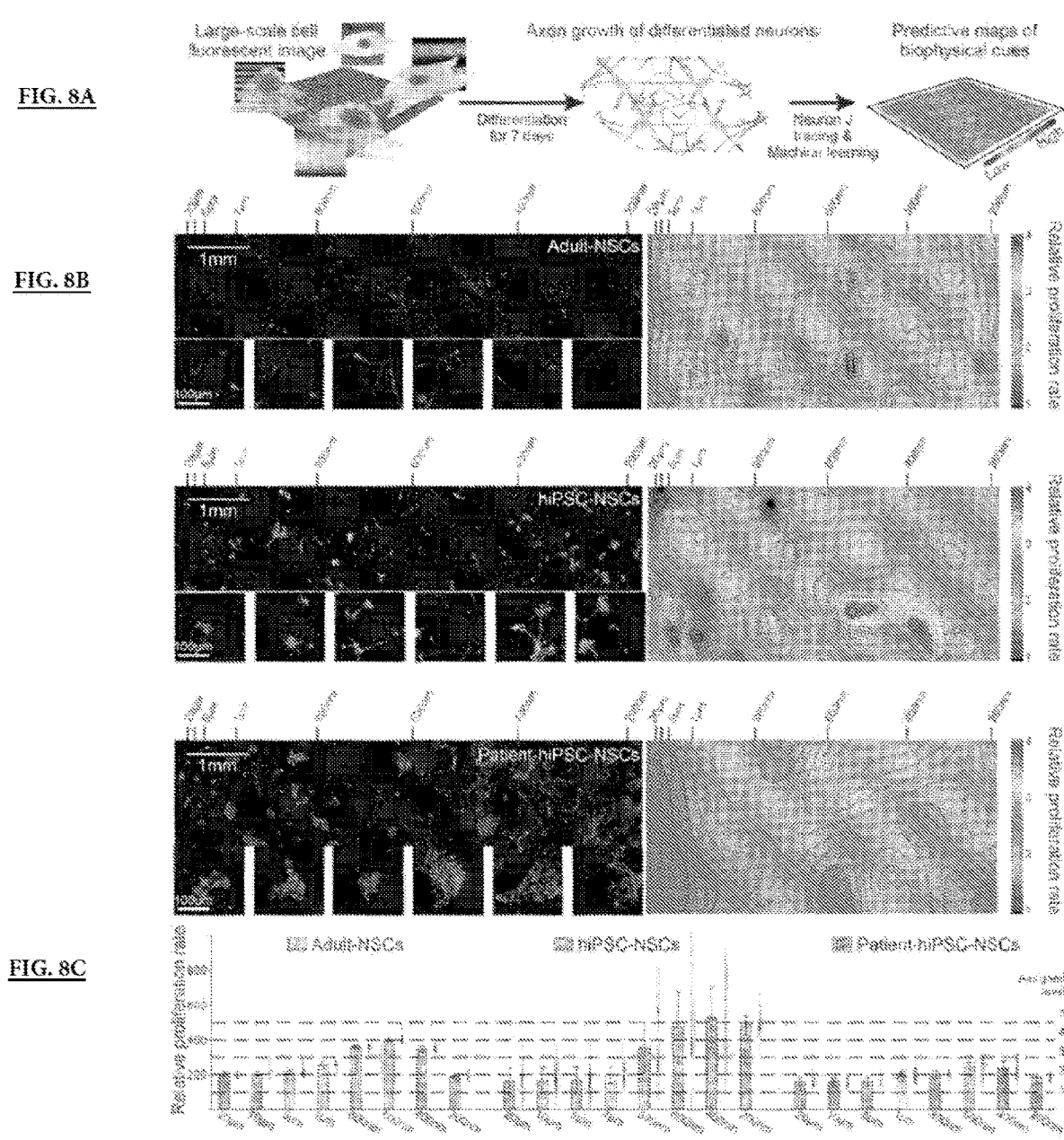
FIG. 8A illustrates a schematic illustration of patterned surface nanoarray-based axonal growth assay.
FIG. 8B illustrates the generated axonal growth maps for adult-NSC, hiPSC-NSC and hiPSC-NSC-Q83.
FIG. 8C illustrates the quantifications at representative biophysical cues.

FIG. 8A illustrates a schematic illustration of patterned surface nanoarray-based axonal growth assay; FIG. 8B illustrates the generated axonal growth maps for adult-NSC, hiPSC-NSC and hiPSC-NSC-Q83; and FIG. 8C illustrates the quantifications at representative biophysical cues (i.e., sizes of the 1D line nanostructures).

Figures 9A, 9B, 9C:
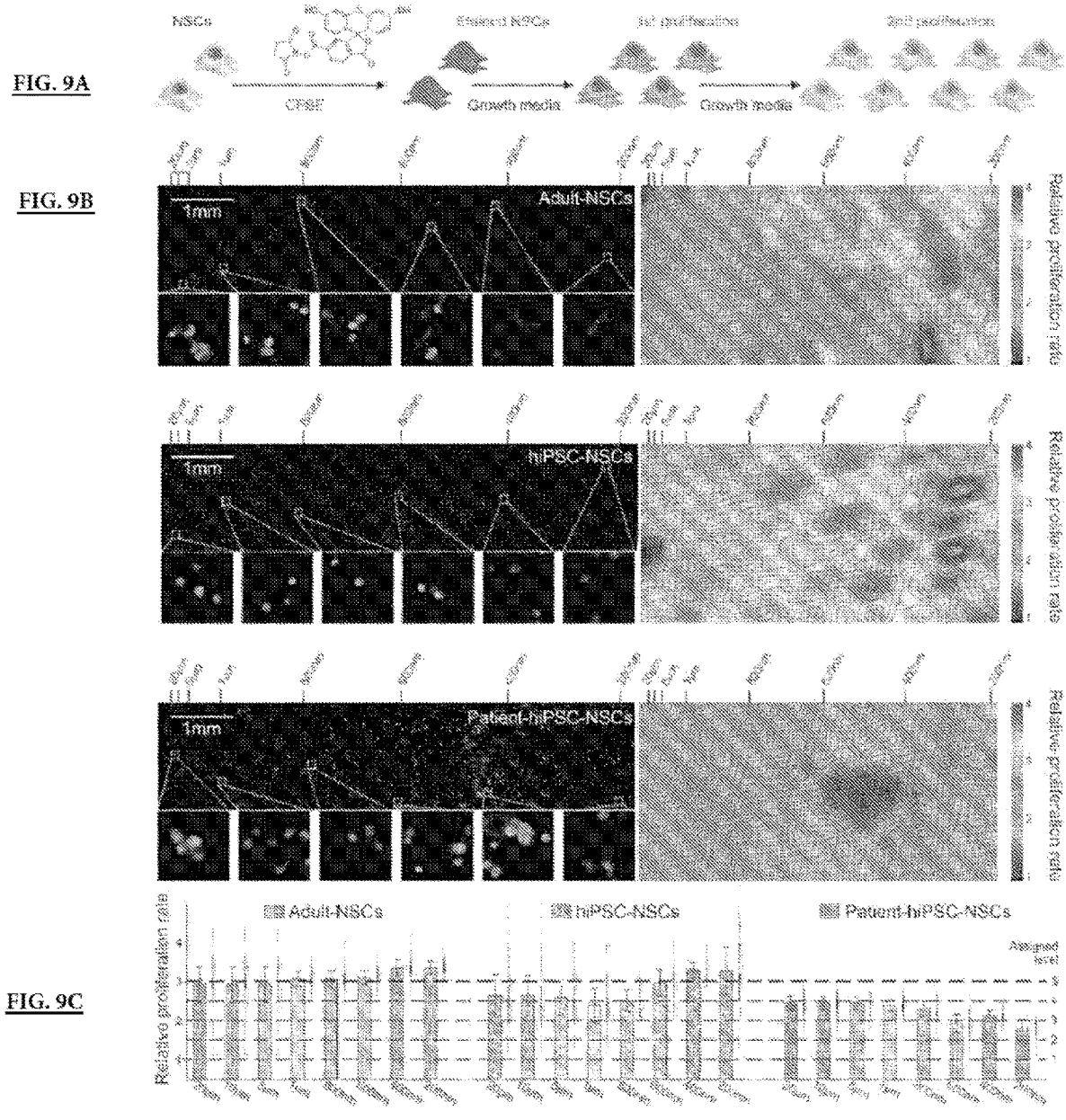
FIG. 9A illustrates a schematic illustration of patterned surface nanoarray-based neuronal proliferation assay.
FIG. 9B illustrates the generated proliferation maps for adult- NSC, hiPSC-NSC and hiPSC-NSC-Q83.
FIG. 9C illustrates the quantifications at representative biophysical cues.

FIG. 9A illustrates a schematic illustration of patterned surface nanoarray-based neuronal proliferation assay; FIG. 9B illustrates the generated proliferation maps for adult-NSC, hiPSC-NSC and hiPSC-NSC-Q83; and FIG. 9C illustrates the quantifications at representative biophysical cues (i.e., sizes of the 1D line nanostructures).

FIG. 10A illustrates schematic diagram of the heterogenous cellular responses to biophysical cues investigated using the patterned surface-based predictive mapping discussed above. FIG. 10B illustrates radar charts of 3 NSC lines [adult-NSC, human induced pluripotent stem cell derived NSC wild type (hiPSC-NSC-WT), and Rett Syndrome (RTT) patient-derived hiPSC-NSC (RTT-patient-hiPSC-NSC)] and reveal their differential responses to biophysical cues. Each radar charts summarizes 5 key cell behaviors regulated by 8 representative sizes with aligned fiber structures, which are all quantified and assessed from varying biophysical cue maps of each NSC type.

It was observed that patient-hiPSC-NSCs show reduced mechanosensitivity and impaired behavioral changes when exposed to the biophysical cues on the nanoarrays of the patterned surface, as compared to hiPSC-NSCs and adult NSCs based on the distinctively different patterns found in radar charts derived from the behavioral maps of the three NSC types (FIG. 10B). Specifically, the lower mechanosen- 1000) and 2 μm (NF-5000) sized aligned nanofibers can be found in TABLE 3. The nanofibers are transferred to glass substrate using silicon glue. Afterwards, the nanofibers were treated by oxygen plasma (Femto Science, Cute series) at $1.5*10^{-1}$ Torr for 60 seconds, sterilized by UV lamp for one hour, and then coated by Matrigel for two hours. Stem cells were seeded to the nanofibers at a density of 40,000 cells per $cm^2$ using identical procedures described in the LCT library-based stem cell screening. Four hours after seeding, FGF2 in the media was withdrawn and stem cells underwent neuronal differentiation for 7 days before they were fixed and immunostained with neuronal markers (TuJ1 and MAP2).

TABLE 3

|  | 200 nm | 500 nm | 1 μm | 5 μm |
|---|---|---|---|---|
| Voltage | 5 kV | 5 kV | 5 kV | 5 kV |
| Concentration (mass) | 1% | 2% | 5% | 10% |
| Rotating drum | 1000 rpm | 1000 rpm | 1000 rpm | 1000 rpm |
| Spinning distance | 10 cm | 10 cm | 10 cm | 10 cm |
| Spinning speed | 1.0 mL/hour | 1.0 mL/hour | 1.0 mL/hour | 1.0 mL/hour | sitivity of patient-hiPSC-NSC is evidenced by largely overlapping responses to differentially sized fiber structures as well as lower adhesion, proliferation rate, and axonal growth regardless of the sizes of the biophysical cues. For example, patient-hiPSC-NSCs only showed small differences in response to alterations of biophysical cues for almost all the crucial neural cell behaviors including adhesion, proliferation, and differentiation. On the contrary, both adhesion and proliferation scores in the radar charts of hiPSCs and adult NSCs showed substantial changes to various biophysical cues. An mRNA array study on the lower expression levels of focal adhesion and mechanotransduction-related genes (e.g., Grb2, Cdc42, Gap43, LLK, Rac1, Src, Vcl, Ctnnb1, Mark1, and RhoA) as compared to the other two healthy NSC types also supported reduced mechanosensitivity in patient-hiPSC-NSCs (FIG. 10C illustrates mRNA microarray results showing the reduced expression of mechanotransduction-relevant genes in RTT-patient-hiPSC-NSCs).

In this way, the patterned surface based mapping method was used to predict cell-type-specific modulation of cell behaviors and genes under various types of biomaterial nanotopographies in highly comprehensive and throughput manners.

Rational Design of Cell-Specific Biomaterials

The information generated from patterned surface based cell maps may be used to guide cell-specific design of biomaterials. Specifically, based on the established radar charts of hiPSC-NSCs and adult NSCs (FIG. 10B), the optimal biophysical cues (e.g., diameters of aligned 1D ECM nanostructures) that led to the most significant axonal alignment for each NSC type were identified. The identified biophysical cues were then used to design nanofibers having the most optimal diameters (as identified by mapping method) in a cell-type-specific manner.

Figures 11A, 11B, 11C:
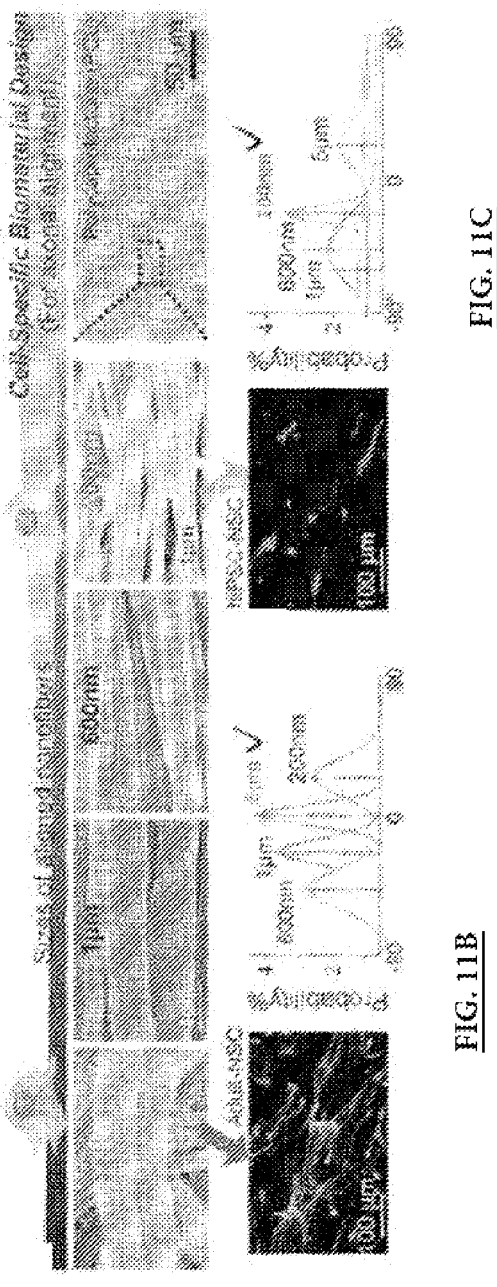
FIG. 11A shows representative FESEM images of cell differentiation assay on these nanofiber biomaterials.
FIG. 11B illustrates cell alignment results from nanofibers with varying diameters of adult-NSC.
FIG. 11C illustrates cell alignment results from nanofibers with varying diameters hiPSC-NSC.

For example, aligned nanofibers with four different diameters (including the optimal diameters predicted by our radar charts) using standard rotating drum electrospinning method were synthesized to validate the high throughput cell screening results. Varying diameters were obtained by controlling the parameters including the concentration of PCL solution, speed of rotating drum, distance between syringe and collector during electrospinning. Detailed parameters for synthesizing 200 nm (NF-200), 500 nm (NF-500), 1 μm (NF- Stem cell differentiation assay on these nanofiber biomaterials with varying topographies successfully matched the predicted trend on the topography-dependent axonal alignment. For example, representative FESEM images shown in FIG. 11A and cell alignment (adult-NSC—FIG. 11B; hiPSC-NSC—FIG. 11C) results from nanofibers with varying diameters support the predicted optimal size in the radar charts in FIG. 10B. As such, the high throughput cell screening and biophysical cue mapping approach for engineering human patient cell-type-specific biomaterials.

Assessing Substrate-Directed Cellular Reprogramming

Figure 12A:
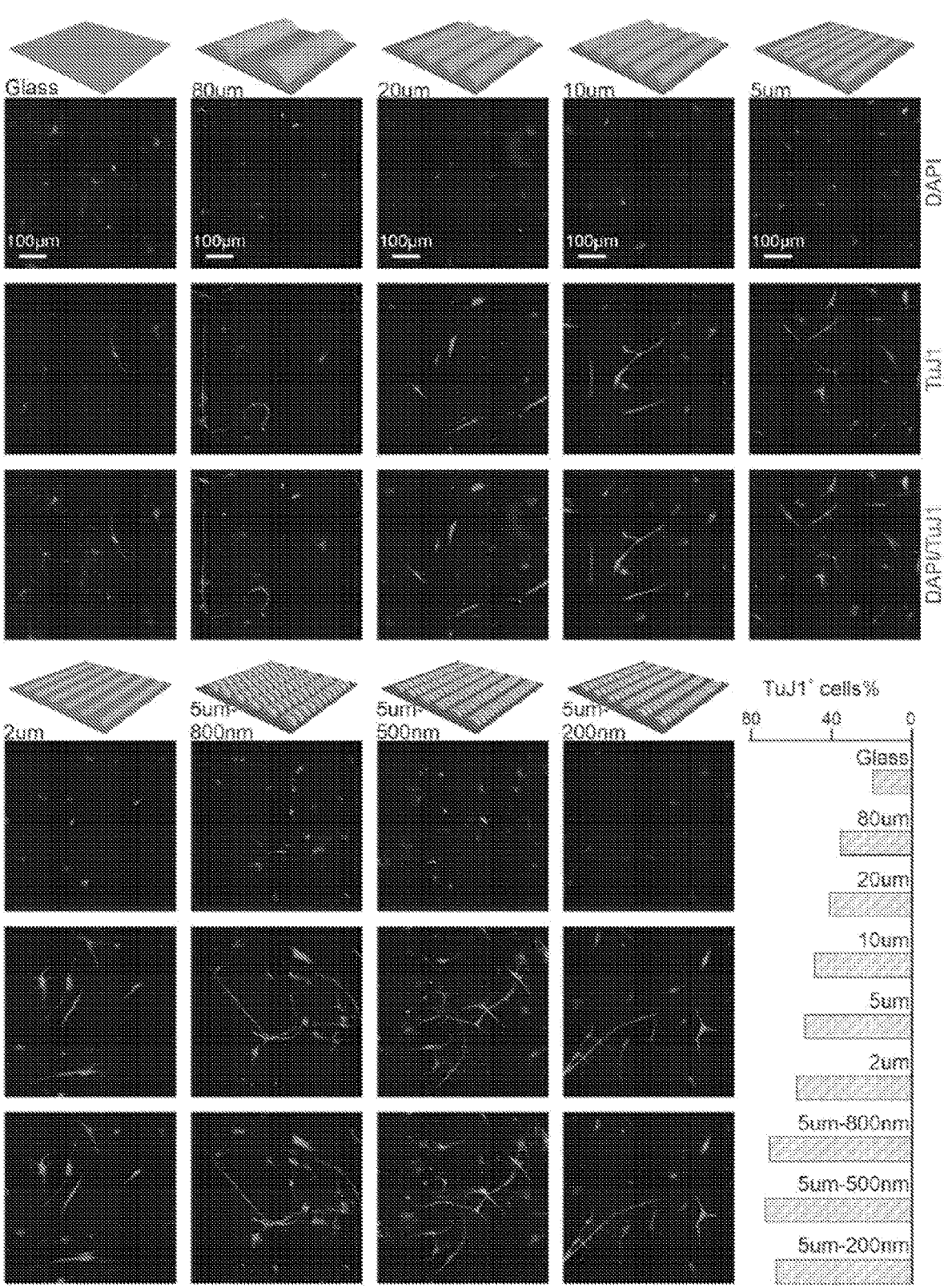
FIG. 12B illustrates a predictive biophysical cue map on the direct reprogramming of fibroblasts generated using the reprogramming assay of fibroblasts on different hierarchical nano-topographical features as shown in FIG. 12A.
Figure 12B:
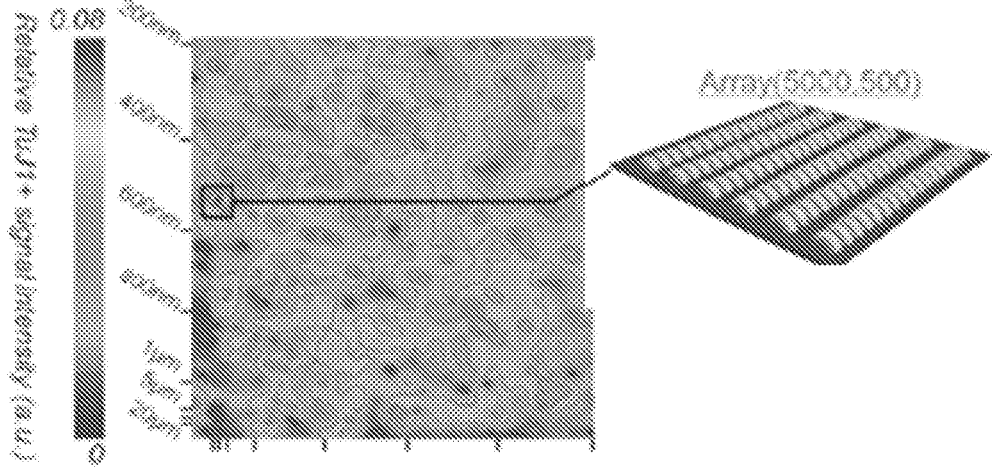

The information generated from patterned surface based cell maps may also be used for biophysical cue-mediated reprogramming of somatic cells (e.g., fibroblasts) for clinical applications. A neuronal reprogramming map of human fibroblasts under varying types of biophysical cues was generated using the patterned surfaces and methods of this disclosure. FIG. 12B illustrates a predictive biophysical cue map on the direct reprogramming of fibroblasts generated using the reprogramming assay of fibroblasts on different hierarchical nano topographical features as shown in FIG. 12A. As shown in FIG. 12B, the identified biophysical cue for maximal reprogramming of fibroblasts into neurons corresponds to an unconventional topographical structure [with major and minor axis sized around 5 μm (5000 nm) and 500 nm, respectively, denoted as array (5000, 500)]. More specifically, the identified hierarchical biophysical cue is composed of a microline (around 5000 nm in diameter) as the major axis, and nanogrids (500 nm) on top of the microlines as the minor axis.

This type of multiscale hierarchical structures universally exist in natural ECMs and are known to affect cell behaviors, but the systematic investigation of their effects on cellular reprogramming has been challenging. Once identified, such structures may be preferentially created on substrates for use in reprogramming of somatic cells. The incorporation of this multiscale structural design principle may be used for further development of biomaterials with higher structural complexity and provide a strategy to improve the efficiency of current biomaterials for cellular reprogramming and tissue engineering.

Figure 13:
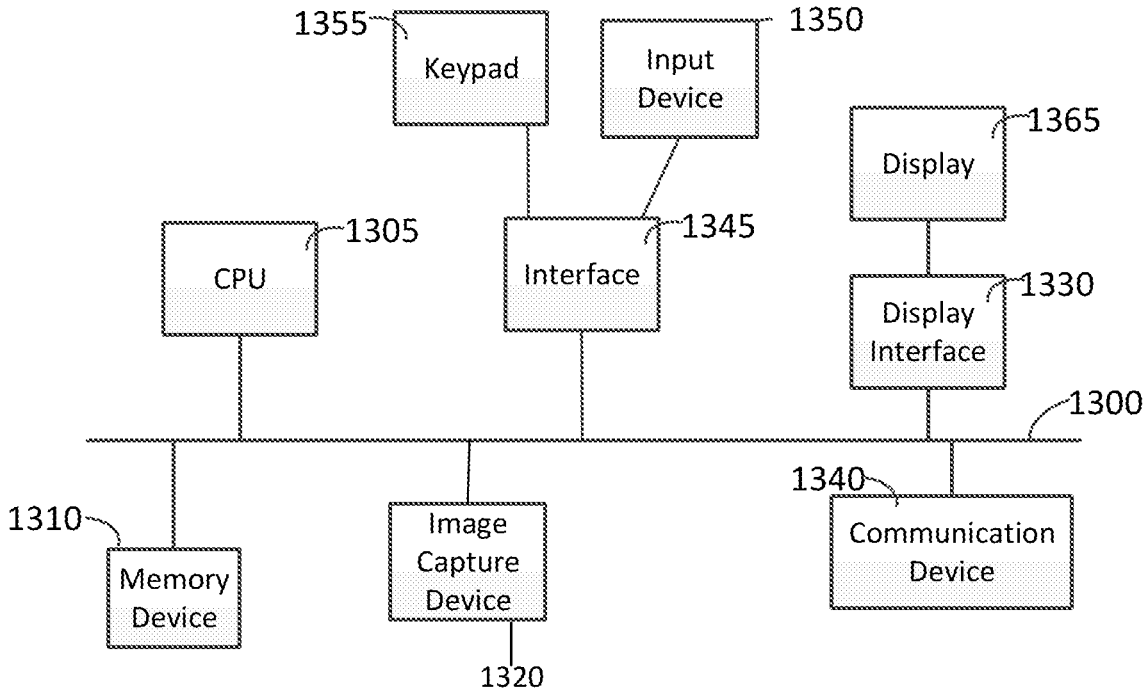
FIG. 13 illustrates an example of internal hardware that may be used to contain or implement the various computer processes and systems, according to an embodiment.

FIG. 13 depicts a block diagram of hardware that may be used to contain or implement program instructions, such as those of a cloud-based server, electronic device, virtual machine, or container. Some or all of the components of FIG. 4 may be included in a controller device described above. A bus 1300 serves as an information highway interconnecting the other illustrated components of the hardware. The bus may be a physical connection between elements of the system, or a wired or wireless communication system via which various elements of the system share data. Processor 1305 is a processing device of the, performing calculations and logic operations required to execute a program. Processor 1305, alone or in conjunction with one or more of the other elements disclosed in FIG. 13, is an example of a processing device, computing device or processor as such terms are used within this disclosure. The processing device may be a physical processing device, a virtual device contained within another processing device, or a container included within a processing device.

A memory device 1310 is a hardware element or segment of a hardware element on which programming instructions, data, or both may be stored. Read only memory (ROM) and random access memory (RAM) constitute examples of memory devices, along with cloud storage services.

An optional display interface 1330 may permit information to be displayed on the display 445 in audio, visual, graphic or alphanumeric format. Communication with external devices may occur using various communication devices 1340, such as a communication port or antenna. A communication device 1340 may be communicatively connected to a communication network, such as the Internet or an intranet.

The hardware may also include a user input interface 1345 which allows for receipt of data from input devices 1350 such as a keyboard or keypad 1355, a mouse, a touch pad, a touch screen, a remote control, a pointing device, a video input device and/or a microphone. Data also may be received from an image capturing device 1320 such as a digital camera or video camera.

Terminology that is relevant to this disclosure includes:

An "electronic device" or a "computing device" refers to a device or system that includes a processor and memory. Each device may have its own processor and/or memory, or the processor and/or memory may be shared with other devices as in a virtual machine or container arrangement. The memory will contain or receive programming instructions that, when executed by the processor, cause the electronic device to perform one or more operations according to the programming instructions. Examples of electronic devices include personal computers, laptop computers, digital display devices, servers, mainframes, virtual machines, containers, televisions, and mobile electronic devices such as smartphones, Internet-connected wearables such as smart watches and smart eyewear, personal digital assistants, cameras, tablet computers, laptop computers, media players and the like. In a client-server arrangement, the client device and the server are electronic devices, in which the server contains instructions and/or data that the client device accesses via one or more communications links in one or more communications networks. In a virtual machine arrangement, a server may be an electronic device, and each virtual machine or container also may be considered an electronic device. In the discussion above, a client device, server device, virtual machine or container may be referred to simply as a "device" for brevity. Additional elements that may be included in electronic devices are discussed above in the context of FIG. 13.

A "controller device", "controller", or "control unit" is an electronic device that is configured to execute commands to control one or more other devices or device components, such as components of a DIL system. A "controller card" or "control card" or "control module" refers to a circuit component that acts as the interface between an input interface (such as an input interface of a controller device) and a component.

The term "micro-structure," as used herein relates to structures that have dimensions that are in the "microscale" size range.

The term "nano-structure," as used herein relates to structures that have dimensions that are in the "nanoscale" size range.

The term "structure density" in the context of this specification refers to the number of structures patterned or disposed within a defined area on a patterned surface or substrate.

The term "array" generally refers to multiple numbers of topographical features/structures distributed within an area and spaced apart, unless otherwise indicated. Structures within an array all do not have to have the same properties such as, without limitation, orientation, size, shape, pitch, or the like. The term "ordered array" generally refers to the placement of elements in a specified or predetermined pattern where the elements have distinct spatial relationships to one another. Hence, the term "ordered array" generally refers to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings.

"Pitch" refers to the width that consists of the ridge width plus the groove width.

"Cell behavior" refers to anything that a cell does in response to its environment. For cells grown in vitro, it refers to anything that cells do in response to the culture conditions, media, environment, endogenous or exogenous stimuli, etc. Cell behavior may involve action and response to stimulation. In particular, cell behavior for the purposes of this disclosure includes growth, differentiation, morphology, alignment, adhesion, proliferation, migration, growth factor sensitivity, and cell viability.

The terms "stem cells," "embryonic stem cells," "adult stem cells," "progenitor cells" and "progenitor cell populations" refer to cells that can be derived from any source and can replicate as undifferentiated or lineage committed cells and have the potential to differentiate into at least one, preferably multiple, cell lineages.

The terms "processor" and "processing device" refer to a hardware component of an electronic device that is configured to execute programming instructions. Except where specifically stated otherwise, the singular terms "processor" and "processing device" are intended to include both single-processing device embodiments and embodiments in which multiple processing devices together or collectively perform a process.

The terms "memory," "memory device," "data store," "computer readable medium," "data storage facility" and the like each refer to a non-transitory device on which computer-readable data, programming instructions or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

In this document, the terms "communication link" and "communication path" mean a wired or wireless path via which a first device sends communication signals to and/or receives communication signals from one or more other devices. Devices are "communicatively connected" if the devices are able to send and/or receive data via a communication link. "Electronic communication" refers to the transmission of data via one or more signals between two or more electronic devices, whether through a wired or wireless network, and whether directly or indirectly via one or more intermediary devices.

Where a range of values is provided, it is understood that each intervening value, to the tenth of the unit of the lower limit unless the context clearly dictates otherwise, between the upper and lower limit of that range and any other stated or intervening value in that stated range, is encompassed within embodiments of the present disclosure. The upper and lower limits of these smaller ranges may independently be included in the smaller ranges and are also encompassed within embodiments of the present disclosure, subject to any specifically excluded limit in the stated range. Where the stated range includes one or both of the limits, ranges excluding either or both of those included limits are also included in embodiments of the present disclosure.

The features and functions described above, as well as alternatives, may be combined into many other systems or applications. Various presently unforeseen or unanticipated alternatives, modifications, variations or improvements may be made by those skilled in the art, each of which is also intended to be encompassed by the disclosed embodiments.

The invention claimed is:

1. A dynamic interference lithography (DIL) device comprising:
- a laser source configured for providing a laser beam;
- a substrate stage configured for mounting a substrate;
- an at least partially convex curved mirror mounted on a rotatable stage; and
- a spatial filter configured to divide the laser beam into a first beam portion directed toward the at least partially convex curved mirror and a second beam portion directed toward the substrate, wherein the first beam portion is reflected by the at least partially convex curved mirror toward the substrate to form an interference pattern on the substrate, wherein the rotatable stage is configured to adjust a location on the at least partially convex curved mirror where the first beam portion is reflected from.

2. The DIL device of claim 1, wherein the at least partially convex curved mirror is mounted on the rotatable stage configured for adjusting an angle at which the first beam portion impinges on the at least partially convex curved mirror.

3. The DIL device of claim 1, wherein the interference pattern comprises a plurality of heterogeneous topographical patterns.

4. The DIL device of claim 3, wherein the plurality of heterogeneous topographic patterns comprise at least one of the following topographic features: grooves, grids, pores, lines, dots, bumps, gratings, pillars, dimples, curved lens structures, or complex three-dimensional hierarchical structures of calculated dimensions.

5. The DIL device of claim 3, wherein at least two of the plurality of heterogeneous topographic patterns have topographical features that differ in at least one of the following properties: shape, size, height, pitch, orientation, type, periodicity, spacing, composition, elasticity, or stiffness.

6. The DIL device of claim 3, further comprising a controller device configured to control a position of the at least partially convex curved mirror to create formation of the interference pattern that comprises the plurality of heterogeneous topographic patterns.

7. The DIL device of claim 6, wherein the controller device is configured to control a position of the at least partially convex curved mirror such that an angle of incidence of the first beam portion on the at least partially curved mirror is about 0°-90°.

8. The DIL device of claim 3, further comprising a controller device configured to control the laser source for providing a desired number of laser beams.

9. The DIL device of claim 1, wherein a focal length of the at least partially convex curved mirror is about 1.0 millimeter to about 1.0 meter.

* * * * *